(12) United States Patent
Widjaja

(10) Patent No.: US 10,032,514 B2
(45) Date of Patent: Jul. 24, 2018

(54) SEMICONDUCTOR MEMORY HAVING BOTH VOLATILE AND NON-VOLATILE FUNCTIONALITY INCLUDING RESISTANCE CHANGE MATERIAL AND METHOD OF OPERATING

(71) Applicant: Zeno Semiconductor, Inc., Sunnyvale, CA (US)

(72) Inventor: Yuniarto Widjaja, San Jose, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 15/724,651

(22) Filed: Oct. 4, 2017

(65) Prior Publication Data

US 2018/0025780 A1  Jan. 25, 2018

Related U.S. Application Data

(60) Continuation of application No. 15/292,098, filed on Oct. 12, 2016, now Pat. No. 9,812,203, which is a
(Continued)

(51) Int. Cl.
*G11C 14/00* (2006.01)
*H01L 27/24* (2006.01)
(Continued)

(52) U.S. Cl.
CPC ........ *G11C 14/0045* (2013.01); *G06F 3/0619* (2013.01); *G06F 3/0647* (2013.01);
(Continued)

(58) Field of Classification Search
CPC ............ G11C 14/0045; G11C 13/0007; G11C 11/404; G11C 13/0033; G11C 11/14;
(Continued)

(56) References Cited

U.S. PATENT DOCUMENTS 4,300,212 A  11/1981  Simko
4,959,812 A  9/1990  Momodomi et al.
(Continued)

OTHER PUBLICATIONS

Chatterjee, et al. "Taper isolated dynamic gain RAM cell." Electron Devices Meeting, 1978 International. vol. 24. IEEE, 1978, pp. 698-699.
(Continued)

*Primary Examiner* — Khamdan Alrobaie
(74) *Attorney, Agent, or Firm* — Alan W. Cannon

(57) ABSTRACT

Semiconductor memory is provided wherein a memory cell includes a capacitorless transistor having a floating body configured to store data as charge therein when power is applied to the cell. The cell further includes a nonvolatile memory comprising a resistance change element configured to store data stored in the floating body under any one of a plurality of predetermined conditions. A method of operating semiconductor memory to function as volatile memory, while having the ability to retain stored data when power is discontinued to the semiconductor memory is described.

20 Claims, 14 Drawing Sheets

Related U.S. Application Data continuation of application No. 14/738,349, filed on Jun. 12, 2015, now Pat. No. 9,490,012, which is a division of application No. 13/244,812, filed on Sep. 26, 2011, now Pat. No. 9,087,580, which is a continuation of application No. 12/545,623, filed on Aug. 21, 2009, now Pat. No. 8,159,868.

(60) Provisional application No. 61/091,071, filed on Aug. 22, 2008.

(51) Int. Cl.
|  |  |
| --- | --- |
| *H01L 45/00* | (2006.01) |
| *G11C 11/14* | (2006.01) |
| *H01L 29/78* | (2006.01) |
| *H01L 27/102* | (2006.01) |
| *H01L 27/108* | (2006.01) |
| *G06F 3/06* | (2006.01) |
| *G11C 11/56* | (2006.01) |
| *G11C 11/404* | (2006.01) |
| *G11C 13/00* | (2006.01) |

(52) U.S. Cl.
CPC ............ *G06F 3/0685* (2013.01); *G11C 11/14* (2013.01); *G11C 11/404* (2013.01); *G11C 11/5678* (2013.01); *G11C 11/5685* (2013.01); *G11C 13/0004* (2013.01); *G11C 13/0007* (2013.01); *G11C 13/0033* (2013.01); *H01L 27/108* (2013.01); *H01L 27/1023* (2013.01); *H01L 27/10802* (2013.01); *H01L 27/10897* (2013.01); *H01L 27/24* (2013.01); *H01L 27/2445* (2013.01); *H01L 27/2463* (2013.01); *H01L 29/7841* (2013.01); *H01L 45/06* (2013.01); *H01L 45/065* (2013.01); *H01L 45/085* (2013.01); *H01L 45/1233* (2013.01); *H01L 45/1253* (2013.01); *H01L 45/141* (2013.01); *H01L 45/146* (2013.01); *H01L 45/147* (2013.01); *G11C 2013/0045* (2013.01); *G11C 2013/0078* (2013.01); *G11C 2211/4016* (2013.01); *G11C 2211/5643* (2013.01); *G11C 2213/31* (2013.01); *G11C 2213/32* (2013.01)

(58) Field of Classification Search
CPC ............ G11C 11/5678; G11C 11/5685; G11C 13/0004; G11C 2013/0078; G11C 2013/0045; G11C 2213/31; G11C 2211/4016; G11C 2213/32; G11C 2211/5643
See application file for complete search history.

(56) References Cited

U.S. PATENT DOCUMENTS

| | | | |
|---|---|---|---|
| 5,137,838 A | 8/1992 | Ramde et al. | |
| 5,519,831 A | 5/1996 | Holzhammer | |
| 5,581,504 A | 12/1996 | Chang et al. | |
| 5,767,549 A | 6/1998 | Chen et al. | |
| 5,999,444 A | 12/1999 | Fujiwara et al. | |
| 6,005,818 A | 12/1999 | Ferrant et al. | |
| 6,141,248 A | 10/2000 | Forbes et al. | |
| 6,163,048 A | 12/2000 | Hirose et al. | |
| 6,166,407 A | 12/2000 | Ohta | |
| 6,341,087 B1 | 1/2002 | Kunikiyo et al. | |
| 6,356,485 B1 | 3/2002 | Proebsting | |
| 6,376,876 B1 | 4/2002 | Shin et al. | |
| 6,542,411 B2 | 4/2003 | Tanikawa et al. | |
| 6,614,684 B1 | 9/2003 | Shukuri et al. | |
| 6,661,042 B2 | 12/2003 | Hsu | |
| 6,686,624 B2 | 2/2004 | Hsu | |
| 6,687,152 B2 | 2/2004 | Ohsawa | |
| 6,724,657 B2 | 4/2004 | Shukuri et al. | |
| 6,791,882 B2 | 9/2004 | Seki et al. | |
| 6,801,452 B2 | 10/2004 | Miwa et al. | |
| 6,885,581 B2 | 4/2005 | Nemati et al. | |
| 6,913,964 B2 | 7/2005 | Hsu | |
| 6,925,006 B2 | 8/2005 | Fazan et al. | |
| 6,954,377 B2 | 10/2005 | Choi et al. | |
| 6,969,662 B2 | 11/2005 | Fazan et al. | |
| 7,085,156 B2 | 8/2006 | Ferrant et al. | |
| 7,118,986 B2 | 10/2006 | Steigerwalt et al. | |
| 7,170,807 B2 | 1/2007 | Fazan et al. | |
| 7,224,019 B2 | 5/2007 | Hieda et al. | |
| 7,259,420 B2 | 8/2007 | Anderson et al. | |
| 7,259,992 B2 | 8/2007 | Shirota | |
| 7,285,820 B2 | 10/2007 | Park et al. | |
| 7,301,803 B2 | 11/2007 | Okhonin et al. | |
| 7,329,580 B2 | 2/2008 | Cho et al. | |
| 7,440,317 B2 * | 10/2008 | Bhattacharyya ... | G11C 16/0466 257/E29.302 |
| 7,440,333 B2 | 10/2008 | Hsia et al. | |
| 7,447,068 B2 | 11/2008 | Tsai et al. | |
| 7,450,423 B2 | 11/2008 | Lai et al. | |
| 7,473,611 B2 | 1/2009 | Cho et al. | |
| 7,504,302 B2 | 3/2009 | Matthew et al. | |
| 7,541,636 B2 | 6/2009 | Ranica et al. | |
| 7,542,345 B2 | 6/2009 | Okhonin et al. | |
| 7,579,241 B2 | 8/2009 | Hieda et al. | |
| 7,609,551 B2 | 10/2009 | Shino et al. | |
| 7,622,761 B2 | 11/2009 | Park et al. | |
| 7,701,763 B2 | 4/2010 | Roohparvar | |
| 7,733,693 B2 | 6/2010 | Ferrant et al. | |
| 7,759,715 B2 | 7/2010 | Bhattacharyya | |
| 7,760,548 B2 | 7/2010 | Widjaja | |
| 7,847,338 B2 | 12/2010 | Widjaja | |
| 8,014,200 B2 | 9/2011 | Widjaja | |
| 8,036,033 B2 | 10/2011 | Widjaja | |
| 8,059,459 B2 | 11/2011 | Widjaja | |
| 8,077,536 B2 | 12/2011 | Widjaja | |
| 8,130,548 B2 | 3/2012 | Widjaja et al. | |
| 8,159,868 B2 | 4/2012 | Widjaja | |
| 8,159,878 B2 | 4/2012 | Widjaja | |
| 8,174,886 B2 | 5/2012 | Widjaja et al. | |
| 8,194,451 B2 | 6/2012 | Widjaja | |
| 8,208,302 B2 | 6/2012 | Widjaja | |
| 8,243,499 B2 | 8/2012 | Widjaja | |
| 8,294,193 B2 | 10/2012 | Widjaja | |
| 8,391,066 B2 | 3/2013 | Widjaja | |
| 8,472,249 B2 | 6/2013 | Widjaja | |
| 8,559,257 B2 | 10/2013 | Widjaja | |
| 8,570,803 B2 | 10/2013 | Widjaja | |
| 8,787,085 B2 | 7/2014 | Widjaja | |
| 8,837,247 B2 | 9/2014 | Widjaja | |
| 8,923,052 B2 | 12/2014 | Widjaja | |
| 9,087,580 B2 | 7/2015 | Widjaja | |
| 9,153,333 B2 | 10/2015 | Widjaja | |
| 9,230,965 B2 | 1/2016 | Widjaja | |
| 9,257,179 B2 | 2/2016 | Widjaja | |
| 9,460,790 B2 | 10/2016 | Widjaja | |
| 9,484,082 B2 | 11/2016 | Widjaja | |
| 9,490,012 B2 | 11/2016 | Widjaja | |
| 9,646,693 B2 | 5/2017 | Widjaja | |
| 9,761,311 B2 | 9/2017 | Widjaja | |
| 9,761,589 B2 | 9/2017 | Widjaja | |
| 9,812,203 B2 | 11/2017 | Widjaja | |
| 2002/0018366 A1 | 2/2002 | von Schwerin et al. | |
| 2002/0048193 A1 | 4/2002 | Tanikawa et al. | |
| 2003/0168677 A1 * | 9/2003 | Hsu ....................... | H01L 27/108 257/239 |
| 2003/0235095 A1 | 12/2003 | Inoue | |
| 2005/0024968 A1 | 2/2005 | Lee et al. | |
| 2005/0032313 A1 | 2/2005 | Forbes | |
| 2005/0124120 A1 | 6/2005 | Du et al. | |
| 2005/0240867 A1 | 10/2005 | Forbes | |
| 2006/0044915 A1 | 3/2006 | Park et al. | |
| 2006/0056234 A1 | 3/2006 | Lowrey | |
| 2006/0120138 A1 * | 6/2006 | Liaw ..................... | B82Y 10/00 365/149 |
| 2006/0125010 A1 | 6/2006 | Bhattacharyya | |
| 2006/0146606 A1 | 7/2006 | Bhattacharyya et al. | |

(56) References Cited

U.S. PATENT DOCUMENTS

| | | |
|---|---|---|
| 2006/0157679 A1 | 7/2006 | Scheuerlein |
| 2006/0193174 A1 | 8/2006 | Choi et al. |
| 2006/0221670 A1 | 10/2006 | Forbes et al. |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0090443 A1 | 4/2007 | Choi et al. |
| 2007/0138530 A1 | 6/2007 | Okhonin |
| 2007/0164351 A1 | 7/2007 | Hamamoto |
| 2007/0164352 A1 | 7/2007 | Padilla |
| 2007/0210338 A1 | 9/2007 | Orlowski |
| 2007/0215954 A1 | 9/2007 | Mouli |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0123418 A1 | 5/2008 | Widjaja |
| 2008/0180995 A1 | 7/2008 | Okhonin |
| 2008/0224202 A1 | 9/2008 | Young et al. |
| 2008/0265305 A1 | 10/2008 | He et al. |
| 2008/0280414 A1 | 11/2008 | Zaman |
| 2008/0303079 A1 | 12/2008 | Cho et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0246277 A1 | 9/2010 | Widjaja |
| 2010/0246284 A1 | 9/2010 | Widjaja |
| 2011/0032756 A1 | 2/2011 | Widjaja |
| 2011/0042736 A1 | 2/2011 | Widjaja |
| 2011/0044110 A1 | 2/2011 | Widjaja |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0106234 A1 | 5/2012 | Widjaja |
| 2012/0113712 A1 | 5/2012 | Widjaja |
| 2012/0230123 A1 | 9/2012 | Widjaja et al. |
| 2013/0148422 A1 | 6/2013 | Widjaja |
| 2013/0250685 A1 | 9/2013 | Widjaja |
| 2014/0021549 A1 | 1/2014 | Widjaja |
| 2014/0332899 A1 | 11/2014 | Widjaja |
| 2014/0355343 A1 | 12/2014 | Widjaja |
| 2015/0109860 A1 | 4/2015 | Widjaja |
| 2015/0310917 A1 | 10/2015 | Widjaja |
| 2015/0371707 A1 | 12/2015 | Widjaja |
| 2016/0086655 A1 | 3/2016 | Widjaja |
| 2016/0111158 A1 | 4/2016 | Widjaja |
| 2017/0025534 A1 | 1/2017 | Widjaja |
| 2017/0032842 A1 | 2/2017 | Widjaja |
| 2017/0040326 A1 | 2/2017 | Widjaja |
| 2017/0213593 A1 | 7/2017 | Widjaja |
| 2017/0365340 A1 | 12/2017 | Widjaja |
| 2017/0365607 A1 | 12/2017 | Widjaja |

OTHER PUBLICATIONS

Chatterjee, et al. Circuit Optimization of the Paper Isolated Dynamic Gain RAM Cell for VLSI Memories, pp. 22-23, 1979.

Chatterjee, et al. "A survey of high-density dynamic RAM cell concepts." Electron Devices, IEEE Transactions on 26.6 (1979): 827-839.

Erb, D. "Stratified charge memory." Solid-State Circuits Conference. Digest of Technical Papers. 1978 IEEE International. vol. 21. IEEE, 1978, pp. 24-25.

Leiss, et al, "dRAM Design Using the Taper-Isolated Dynamic RAM Cell." Solid-State Circuits, IEEE Journal of 17.2 (1982): 337-344.

Ohsawa, et al. Autonomous refresh of floating body cell (FBC).pp. 801-804, 2008.

Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.

Ranica, et al. "Scaled IT-Bulk devices built with CMOS 90nm technology for low-cost eDRAM applications." VLSI Technology, 2005. Digest of Technical Papers. 2005 Symposium on. IEEE, 2005, pp. 38-39.

Reisch, "On bistable behavior and open-base breakdown of bipolar transistors in the avalanche regime-modeling and applications." Electron Devices, IEEE Transactions on 39.6 (1992): 1398-1409.

Lin, et al., A new 1T DRAM Cell with enhanced Floating Body Effect, pp. 1-5, 2006.

Lanyon, et al., "Bandgap Narrowing in Moderately to Heavily Doped Silicon", pp. 1014-1018, No. 7, vol. ED-26, 1.

Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.

Sakui, K., et al. "A new static memory cell based on the reverse base current effect of bipolar transistors." Electron Devices, IEEE Transactions on 36.6 (1989): 1215-1217.

Sze, et al. Physics of Semiconductor Devices, Wiley-Interscience, 2007, pp. 104.

Terada, et al. "A new VLSI memory cell using capacitance coupling (CC cell)." Electron Devices, IEEE Transactions on 31.9 (1984): pp. 319-1324.

Oh, et al., a 4-Bit Double SONOS memory (DSM) with 4 Storage Nodes Per Cell for Ultimate Multi-Bit Operation, pp. 1-2, 2006, Symposium on VLSI Technology Digest of Technical Papers.

Villaret, et al. "Further insight into the physics and modeling of floating-body capacitorless DRAMs." Electron Devices, IEEE Transactions on 52.11 (2005): pp. 2447-2454.

Villaret et al., "Mechanisms of charge modulation in the floating body of triple-well nMOSFET capacitor-less DRAMs", Microelectronic Engineering 72 (2004) 434-439.

Ban et al., A Scaled Floating Body Cell (FBC) Memory with High-k+Metal Gate on Thin-Silicon and Thin-Box for 16-nm Technology Node and Beyond, Symposium on VLSI Technology, 2008, pp. 92-93.

Campardo G. et al., VLSI Design of Non-Volatile Memories, 2005.

Han et al. Programming/Erasing Characteristics of 45 nm NOR-Type Flash Memory Based on SOI FinFET Structure. vol. 47, Nov. 2005, pp. S564-S567.

Headland. Hot electron injection, Feb. 19, 2004.

Ohsawa et al., Memory Design Using One-Transistor Gain Cell on SOI, Tech. Digest, IEEE International Solid-State Circuits, vol. 37, No. 11, 2002, pp. 1510-1522.

Ohsawa et al., An 18.5ns 128Mb SOI DRAM with a Floating body Cell, IEEE International Solid-State Circuits Conference, 2005, pp. 458-459, 609.

Okhonin et al., A Capacitor-less 1T-DRAM Cell, IEEE Electron Device Letters, vol. 23, No. 2, Feb. 2002, pp. 85-87.

Okhonin et al. A SOI Capacitor-less 1T-DRAM Concept. 2001, pp. 153-154.

Okhonin, et al., Principles of Transient Charge Pumping on Partially Depleted SOI MOSFETs, IEEE Electron Device Letters, vol. 23, No. 5, May 2002, pp. 279-281.

Pellizzer et al., A 90nm Phase Change Memory Technology for Stand-Alone Non-Volatile Memory Applications, pp. 1-1, 2006.

Ranica et al. Scaled 1T-Bulk devices built with CMOS 90nm technology for low-cost eDRAM applications. Pascale. mazoyer@st.com, 2004, pp. 128-129.

(56) References Cited

OTHER PUBLICATIONS

Robert F. Pierret. Semiconductor Device Fundamentals, ISBN: 0-201-54393-1, 1996, by Addison-Wesley Publishing Company, Inc. PNPN Devices 463-476.
Tack et al., The Multistable Charge-Controlled Memory Effect in SOI Transistors at Low Temperatures, IEEE Transactions on Electron Devices, vol. 37, May 1990, pp. 1373-1382.
Yoshida et al., A Design of a Capacitorless 1T-DRAM Cell Using Gate-Induced Drain Leakage (GIDL) Current for Low-power and High-speed Embedded Memory, International Electron Devices Meeting, 2003, pp. 1-4.

* cited by examiner

SEMICONDUCTOR MEMORY HAVING BOTH VOLATILE AND NON-VOLATILE FUNCTIONALITY INCLUDING RESISTANCE CHANGE MATERIAL AND METHOD OF OPERATING

This application is a continuation application of co-pending application Ser. No. 15/292,098, filed Oct. 12, 2016, which is a continuation application of application Ser. No. 14/738,349, filed Jun. 12, 2015, now U.S. Pat. No. 9,490,012, issued Nov. 8, 2016, which is a divisional application of application Ser. No. 13/244,812, filed Sep. 26, 2011, now U.S. Pat. No. 9,087,580, issued Jul. 21, 2015, which is a continuation application of application Ser. No. 12/545,623, filed Aug. 21, 2009, now U.S. Pat. No. 8,159,868, issued Apr. 17, 2012, which claims the benefit of U.S. Provisional Application No. 61/091,071, filed Aug. 22, 2008, which applications and patents are each hereby incorporated herein, in their entireties, by reference thereto. We claim priority to application Ser. Nos. 15/292,098; 14/738,349; 13/244,812 and 12/545,623 under 35 U.S.C. Section 120 and claim priority to Application Ser. No. 61/091,071 under 35 U.S.C. Section 119.

FIELD OF THE INVENTION

The present invention relates to semiconductor memory technology. More specifically, the present invention relates to semiconductor memory having both volatile and non-volatile functionality.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

Non-volatile memory devices, such as flash erasable programmable read only memory (Flash EPROM) devices retain stored data even in the absence of power supplied thereto. Unfortunately, non-volatile memory devices typically operate more slowly than volatile memory devices. Accordingly, it would be desirable to provide a universal type memory device that includes the advantages of both volatile and non-volatile memory devices, i.e., fast operation on par with volatile memories, while having the ability to retain stored data when power is discontinued to the memory device. It would further be desirable to provide such a universal type memory device having a size that is not prohibitively larger than comparable volatile or non-volatile devices.

SUMMARY OF THE INVENTION

A semiconductor memory cell is provided, including: a capacitorless transistor having a floating body configured to store data as charge therein when power is applied to the cell; and a nonvolatile memory comprising a resistance change element configured to store data stored in the floating body under any one of a plurality of predetermined conditions.

In at least one embodiment, the resistance change element comprises a phase change material.

In at least one embodiment, the resistance change element comprises a metal-insulator-metal system.

In at least one embodiment, one of the conditions comprises an instruction to back up the data stored in the floating body.

In at least one embodiment, one of the predetermined conditions comprises loss of power to the cell, wherein the cell is configured to perform a shadowing process wherein the data in the floating body is loaded into and stored in the nonvolatile memory.

In at least one embodiment, the loss of power to the cell is one of unintentional power loss or intentional power loss, wherein intentional power loss is predetermined to conserve power.

In at least one embodiment, upon restoration of power to the cell, the data in the nonvolatile memory is loaded into the floating body and stored therein.

In at least one embodiment, the cell is configured to reset the nonvolatile memory to an initial state after loading the data into the floating body upon the restoration of power.

In at least one embodiment, the resistance change element is configured to be set to a high resistance state in a first state and is configured to be set to a low resistance state in a second state, and wherein the reset to the initial state comprises resetting the resistance change element to the high resistance state.

In at least one embodiment, the resistance change element is configured to be set to a high resistance state in a first state and is configured to be set to a low resistance state in a second state, and wherein the reset to the initial state comprises resetting the resistance change element to the low resistance state.

In at least one embodiment, a semiconductor memory array is provided that includes a plurality of the semiconductor memory cells arranged in a matrix of rows and columns.

A method of operating semiconductor memory to function as volatile memory, while having the ability to retain stored data when power is discontinued to the semiconductor memory is provided, including: storing data in a capacitorless transistor having a floating body configured to store data as charge therein when power is applied to the memory; and storing data in a resistance change element by configuring the resistance change element in one of a plurality of resistivity states, wherein each of the resistivity states corresponds to a different data value, respectively.

In at least one embodiment, the resistance change element is configurable to a high resistivity state and a low resistivity state, respectively.

In at least one embodiment, the resistance change element stores multi-bit data and is configurable to a high resistivity state, an intermediate-high resistivity state having a resistivity less than the high resistivity state, an intermediate-low resistivity state having less resistivity than the intermediate-high resistivity state, and a low resistivity state having less resistivity than the intermediate-low resistivity state, respectively.

In at least one embodiment, the capacitorless transistor and the resistance change element are included in a memory cell, the cell comprising a substrate being made of a material having a first conductivity type selected from p-type conductivity type and n-type conductivity type; a first region having a second conductivity type selected from the p-type and n-type conductivity types, the second conductivity type being different from the first conductivity type; a second region having the second conductivity type, the second region being spaced apart from the first region; a buried layer in the substrate below the first and second regions, spaced apart from the first and second regions and having the second conductivity type; a body region formed between the first and second regions and the buried layer, the body region having the first conductivity type and storing the data when power is applied to the cell; and a gate positioned between the first and second regions and adjacent the body region; wherein the resistive change element is connected to one of the first and second regions; wherein the capacitorless transistor of the memory cell is configured to store a first data state which corresponds to a first charge in the body region as the in a first configuration, and a second data state which corresponds to a second charge in the body region in a second configuration.

In at least one embodiment, the cell includes a substrate terminal connected to the substrate beneath the buried layer; the resistive change element connected to one of the first and second regions; a source line terminal electrically connected to one of the first region and second regions; a bit line terminal electrically connected to the other of the first and second regions, wherein one of the source line and the bit line is connected to the one of the first and second regions by connection to the resistive change element; a word line terminal connected to the gate; and a buried well terminal electrically connected to the buried layer.

In at least one embodiment, the source line terminal is connected to the resistance change element which is in turn connected to the second region, the method further comprising shadowing data stored in the floating body to the resistance change element, wherein the shadowing is performed by: applying a positive voltage to the source line terminal; applying a substantially neutral voltage to the bit line terminal; applying a neutral voltage or slightly positive voltage to the word line terminal; applying a low positive voltage to the buried well terminal; and applying a substantially neutral voltage to the substrate terminal.

In at least one embodiment, the source line terminal is connected to the resistance change element which is in turn connected to the second region, the method further comprising shadowing data stored in the floating body to the resistance change element, wherein the shadowing is performed by: applying a neutral voltage to the source line terminal; applying a neutral voltage or slightly positive voltage to the word line terminal; applying a positive voltage to the substrate terminal; and allowing the bit line terminal and buried well terminal to float.

In at least one embodiment, the shadowing process is performed non-algorithmically.

In at least one embodiment, when the floating body stores a positive potential, resulting electric current flowing through the resistance change element changes the resistance change material from a low resistivity state to a high resistivity state, and the resistance change material remains in the high resistivity state when voltages to the terminals are discontinued; and when the floating body stores a neutral or negative potential, the capacitorless transistor is turned off and electric current does not flow through the resistance change element, whereby the resistance change element remains in the low resistivity state, and the resistance change material remains in the low resistivity state when voltages to the terminals are discontinued.

In at least one embodiment, the source line terminal is connected to the resistance change element which is in turn connected to the second region, the method further comprising, after discontinuance of power the cell and upon restoring power to the cell, restoring data stored on the resistance change element to the floating body, wherein the restoring data is performed by: applying a negative voltage to the source line terminal; applying a positive voltage to the bit line terminal; applying a negative voltage to the word line terminal; applying a low positive voltage to the buried well terminal; and applying a substantially neutral voltage to the substrate terminal.

In at least one embodiment, the restoring data process is performed non-algorithmically.

In at least one embodiment, when the resistance change element is in a high resistivity state, holes are injected into the floating body causing the floating body to store a positive potential; and when the resistance change element is in a low resistivity state, holes are evacuated from the floating body causing the floating body to store a neutral potential.

In at least one embodiment, the method further includes, after restoring data stored in the floating body, resetting the resistance change element, wherein the resetting comprises resetting the resistance change element to a predetermined resistivity state.

In at least one embodiment, the resetting comprises: applying a positive voltage to the source line terminal; applying a substantially neutral voltage to the bit line terminal; applying a neutral voltage or slightly positive voltage to the word line terminal; applying a positive voltage to the buried well terminal; and applying a substantially neutral voltage to the substrate terminal.

In at least one embodiment, the resetting comprises: applying a neutral voltage to the source line terminal; applying a neutral voltage or slightly positive voltage to the word line terminal; applying a positive voltage to the substrate terminal; and allowing the bit line terminal and buried well terminal to float.

In at least one embodiment, the capacitorless transistor and the resistance change element are included in a memory cell, the cell comprising a silicon-on-insulator substrate, a substrate of the being made of a material having a first conductivity type selected from p-type conductivity type and n-type conductivity type; a first region having a second conductivity type selected from the p-type and n-type conductivity types, the second conductivity type being different from the first conductivity type; a second region having the second conductivity type, the second region being spaced apart from the first region; a buried insulator layer in the substrate below the first and second regions, spaced apart from the first and second regions and insulating a body region from the substrate, the body region formed between the first and second regions and the buried insulator layer, the body region having the first conductivity type and storing the data when power is applied to the cell; and a gate positioned between the first and second regions and adjacent the body region; wherein the resistive change element is connected to one of the first and second regions; wherein the capacitorless transistor of the memory cell is configured to store a first data state which corresponds to a first charge in the body region as the in a first configuration, and a second data state which corresponds to a second charge in the body region in a second configuration.

In at least one embodiment, the cell includes a substrate terminal connected to the substrate beneath the buried insulator layer; the resistive change element connected to one of the first and second regions; a source line terminal electrically connected to one of the first region and second regions; a bit line terminal electrically connected to the other of the first and second regions, wherein one of the source line and the bit line is connected to the one of the first and second regions by connection to the resistive change element; and a word line terminal connected to the gate.

In at least one embodiment, the source line terminal is connected to the resistance change element which is in turn connected to the second region, the method further comprising shadowing data stored in the floating body to the resistance change element, wherein the shadowing is performed by: applying a positive voltage to the source line terminal; applying a substantially neutral voltage to the bit line terminal; applying a neutral voltage or slightly positive voltage to the word line terminal; and applying a neutral or negative voltage to the substrate terminal.

In at least one embodiment, the shadowing process is performed non-algorithmically.

In at least one embodiment, when the floating body stores a positive potential, resulting electric current flowing through the resistance change element changes the resistance change material from a low resistivity state to a high resistivity state, and the resistance change material remains in the high resistivity state when voltages to the terminals are discontinued; and when the floating body stores a neutral or negative potential, the capacitorless transistor is turned off and electric current does not flow through the resistance change element, whereby the resistance change element remains in the low resistivity state, and the resistance change material remains in the low resistivity state when voltages to the terminals are discontinued.

In at least one embodiment, the source line terminal is connected to the resistance change element which is in turn connected to the second region, the method further comprising, after discontinuance of power to the cell and upon restoring power to the cell, restoring data stored on the resistance change element to the floating body, wherein the restoring data is performed by: applying a negative voltage to the source line terminal; applying a positive voltage to the bit line terminal; applying a negative voltage to the word line terminal; and applying a neutral or negative voltage to the substrate terminal.

In at least one embodiment, when the resistance change element is in a high resistivity state, holes are injected into the floating body causing the floating body to store a positive potential; and when the resistance change element is in a low resistivity state, holes are evacuated from the floating body causing the floating body to store a neutral potential.

In at least one embodiment, after restoring data stored in the floating body, the resistance change element is reset, wherein the resetting comprises resetting the resistance change element to a predetermined resistivity state.

In at least one embodiment, the resetting comprises: applying a positive voltage to the source line terminal; applying a substantially neutral voltage to the bit line terminal; applying a neutral voltage or positive voltage to the word line terminal; and applying a neutral or negative voltage to the substrate terminal These and other features of the invention will become apparent to those persons skilled in the art upon reading the details of the memory cells, devices, arrays and methods as more fully described below.

DETAILED DESCRIPTION OF THE INVENTION

Figure 1:
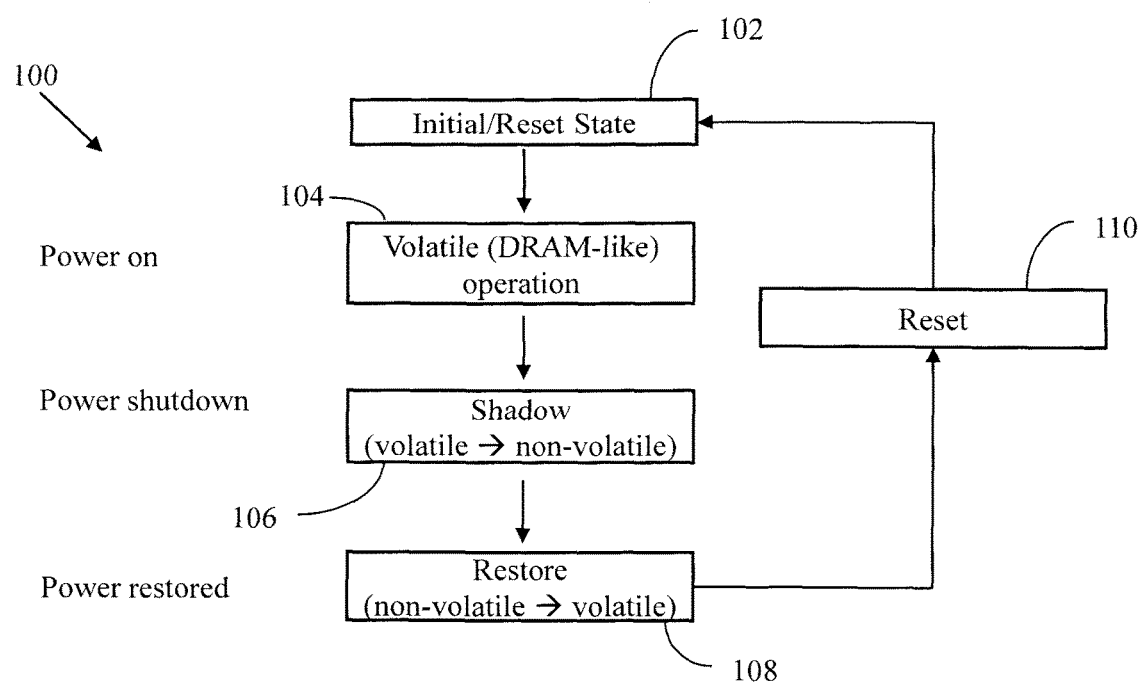
FIG. 1 is a flowchart illustrating operation of a memory device according to an embodiment of the present invention.

Before the present devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a memory cell" includes a plurality of such memory cells and reference to "the device" includes reference to one or more devices and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

When a terminal is referred to as being "left floating", this means that the terminal is not held to any specific voltage, but is allowed to float to a voltage as driven by other electrical forces with the circuit that it forms a part of.

A "resistance change material" refers to a material which resistivity can be modified by means of electrical signals.

Description

The present invention provides a semiconductor memory having both volatile and non-volatile functionality. Referring to FIG. 1, a flowchart 100 illustrates operation of a memory device according to an embodiment of the present invention. At event 102, when power is first applied to a memory device having volatile and non-volatile operation modes, the memory device is placed in an initial state, in the volatile operational mode and the nonvolatile memory of the device is set to a predetermined state. At event 104 the memory device of the present invention operates in the same manner as a conventional DRAM memory cell, i.e., operating as volatile memory. However, during power shutdown, or when power is inadvertently lost, or any other event that discontinues or upsets power to the memory device of the present invention, the content of the volatile memory is loaded into non-volatile memory at event 106, during a process which is referred to here as "shadowing" (event 106), and the data held in volatile memory is lost. Shadowing can also be performed during backup operations, which may be performed at regular intervals during DRAM operation 104 periods, and/or at any time that a user manually instructs a backup. During a backup operation, the content of the volatile memory is copied to the non-volatile memory while power is maintained to the volatile memory so that the content of the volatile memory also remains in volatile memory. Alternatively, because the volatile memory operation consumes more power than the non-volatile storage of the contents of the volatile memory, the device can be configured to perform the shadowing process anytime the device has been idle for at least a predetermined period of time, thereby transferring the contents of the volatile memory into non-volatile memory and conserving power. As one example, the predetermined time period can be about thirty minutes, but of course, the invention is not limited to this time period, as the device could be programmed with virtually any predetermined time period that is longer than the time period required to perform the shadowing process with careful consideration of the non-volatile memory reliability.

After the content of the volatile memory has been moved during a shadowing operation to nonvolatile memory, the shutdown of the memory device occurs, as power is no longer supplied to the volatile memory. At this time, the memory device retains the stored data in the nonvolatile memory. Upon restoring power at event 108, the content of the nonvolatile memory is restored by transferring the content of the non-volatile memory to the volatile memory in a process referred to herein as the "restore" process, after which, upon resetting the memory device at event 110, the memory device may be reset to the initial state (event 102) and again operates in a volatile mode, like a DRAM memory device, event 104.

Figure 2:
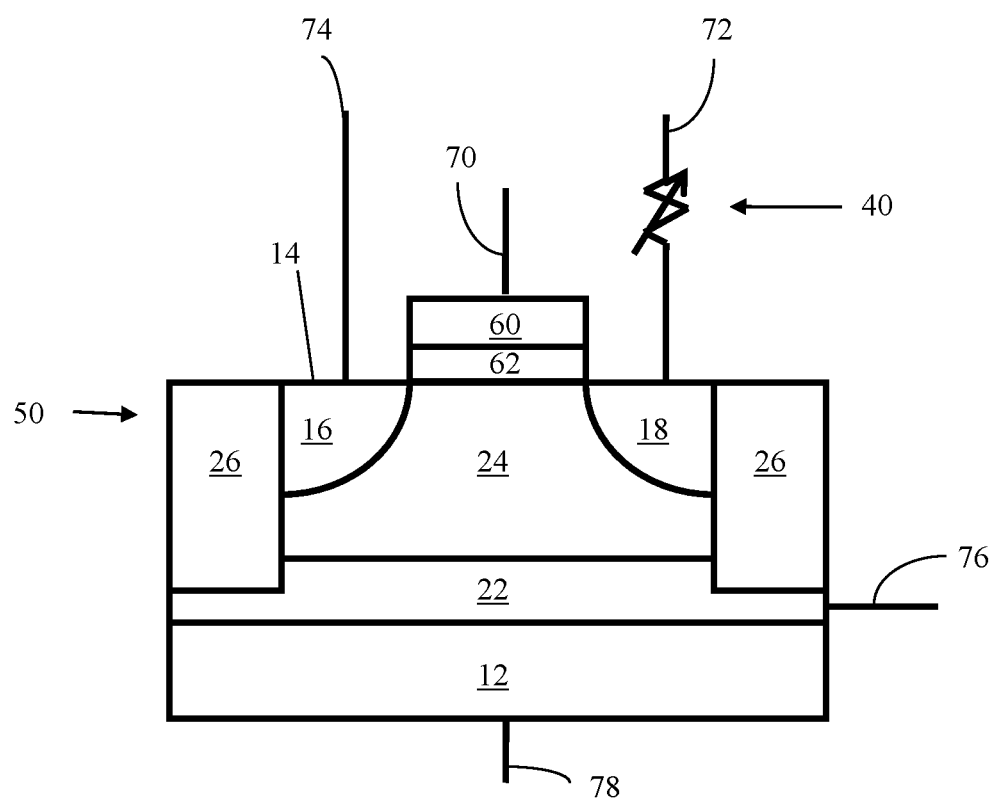
FIG. 2 is a cross-sectional, schematic illustration of a memory cell according to an embodiment of the present invention.

FIG. 2 shows an embodiment of a memory cell 50 according to the present invention. The cell 50 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and which is exposed at surface 14. A second region 18 having the second conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art.

A buried layer 22 of the second conductivity type is also provided in the substrate 12, buried in the substrate 12, as shown. Region 22 is also formed by an ion implantation process on the material of substrate 12. A body region 24 of the substrate 12 is bounded by surface 14, first and second regions 16,18 and insulating layers 26 (e.g. shallow trench isolation (STI, which may be made of silicon oxide, for example). Insulating layers 26 insulate cell 50 from neighboring cells 50 when multiple cells 50 are joined to make a memory device. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

A resistance change memory element 40 is positioned above one of the regions 16, 18 (18 in FIG. 2) having second conductivity type and connected to one of the terminals 72, 74 (74 in FIG. 2). The resistance change memory element 40 is shown as a variable resistor, and may be formed from phase change memory material such as a chalcogenide or may take the form of metal-insulator-metal structure, in which transition metal oxide or perovskite metal oxide is used in conjunction with any reasonably good conductors.

Cell 50 includes several terminals: word line (WL) terminal 70, source line (SL) terminal 72, bit line (BL) terminal 74, buried well (BW) terminal 76 and substrate terminal 78. Terminal 70 is connected to the gate 60. Terminal 74 is connected to first region 16 and terminal 72 is connected to resistance change memory element 40 which is, in turn, connected to second region 18. Alternatively, terminal 72 can be connected to resistance change memory element 40 and terminal 74 can be connected to first region 16. Terminal 76 is connected to buried layer 22 and terminal 78 is connected to substrate 12.

Figure 3:
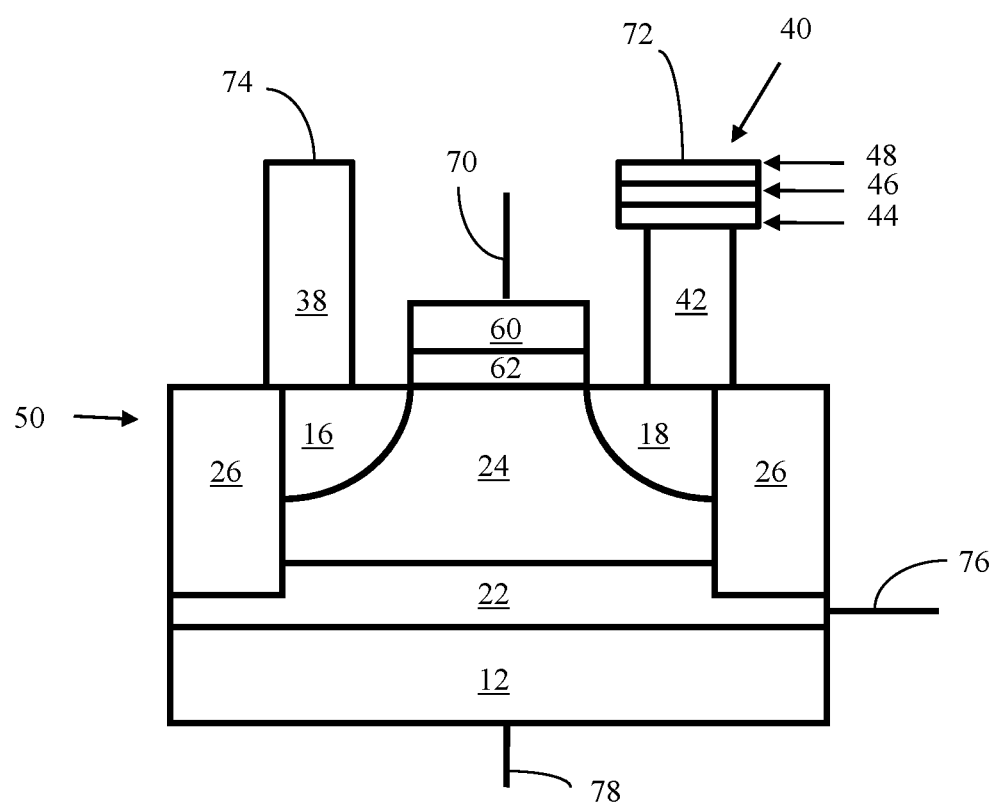
FIG. 3 is a schematic, cross-sectional illustration of a memory cell according to an embodiment of the present invention.

A non-limiting embodiment of the memory cell 50 is shown in FIG. 3. The second conductivity region 16 is connected to an address line terminal 74 through a conductive element 38. The resistance change memory element 40 in this embodiment includes a bottom electrode 44, a resistance change material 46 and a top electrode 48. Resistance change memory element 40 is connected to the second conductivity region 18 on the substrate 12 through a conductive element 42. The resistance change material 46 may be connected to an address line (such as terminal 72 in FIG. 3) through electrode 48 formed from a conductive material. The conductive element 42 may comprise tungsten or silicided silicon materials. Electrodes 44, 48 may be formed from one or more conductive materials, including, but not limited to titanium nitride, titanium aluminum nitride, or titanium silicon nitride. Resistance change material 46 is a material which properties, such as electrical resistance, can be modified using electrical signals. For the case of phase change memory elements, the resistivity depends on the crystalline phase of the material, while for the metal oxide materials, the resistivity typically depends on the presence or absence of conductive filaments. A crystalline phase of a phase change type resistive change material exhibits a low resistivity (e.g., ~1 k$\Omega$) state and an amorphous phase of that material exhibits a high resistivity state (e.g., >100 k$\Omega$). Examples of phase change material include alloys containing elements from Column VI of the periodic table, such as GeSbTe alloys. Examples of metal-insulator-metal resistance change materials include a variety of oxides such as $Nb_2O_5$, $Al_2O_3$, $Ta_2O_5$, $TiO_2$, and NiO and perovskite metal oxides, such as $SrZrO_3$, $(Pr,Ca)MnO_3$ and $SrTiO_3$:Cr.

When power is applied to cell 50, cell 50 operates like a capacitorless DRAM cell. In a capacitorless DRAM device, the memory information (i.e., data that is stored in memory) is stored as charge in the floating body of the transistor, i.e., in the bodies 24 of the cells 50 of a memory device. The presence of the electrical charge in the floating body 24 modulates the threshold voltage of the cell 50, which determines the state of the cell 50. In one embodiment, the non-volatile memory 40 is initialized to have a low resistance state.

A read operation can be performed on memory cell 50 through the following bias condition. A neutral voltage is applied to the substrate terminal 78, a neutral or positive voltage is applied to the BW terminal 76, a substantially neutral voltage is applied to SL terminal 72, a positive voltage is applied to BL terminal 74, and a positive voltage more positive than the voltage applied to BL terminal 74 is applied to WL terminal 70. If cell 50 is in a state "1" having holes in the body region 24, then a lower threshold voltage (gate voltage where the transistor is turned on) is observed compared to the threshold voltage observed when cell 50 is in a state "0" having no holes in body region 24. In one particular non-limiting embodiment, about 0.0 volts is applied to terminal 72, about +0.4 volts is applied to terminal 74, about +1.2 volts is applied to terminal 70, about +0.6 volts is applied to terminal 76, and about 0.0 volts is applied to terminal 78. However, these voltage levels may vary, while maintaining the relative relationships between the voltages applied, as described above.

Alternatively, a substantially neutral voltage is applied to the substrate terminal 78, a neutral or positive voltage is applied to the BW terminal 76, a substantially neutral voltage is applied to SL terminal 72, a positive voltage is applied to BL terminal 74, and a positive voltage is applied to WL terminal 70, with the voltage applied to BL terminal 74 being more positive than the voltage applied to terminal 70. If cell 50 is in a state "1" having holes in the body region 24, then the parasitic bipolar transistor formed by the SL terminal 72, floating body 24, and BL terminal 74 will be turned on and a higher cell current is observed compared to when cell 50 is in a state "0" having no holes in body region 24. In one particular non-limiting embodiment, about 0.0 volts is applied to terminal 72, about +3.0 volts is applied to terminal 74, about +0.5 volts is applied to terminal 70, about +0.6 volts is applied to terminal 76, and about 0.0 volts is applied to terminal 78. However, these voltage levels may vary, while maintaining the relative relationships between the voltages applied, as described above.

Alternatively, a positive voltage is applied to the substrate terminal 78, a substantially neutral voltage is applied to BL terminal 74, and a positive voltage is applied to WL terminal 70. Cell 50 provides a P1-N2-P3-N4 silicon controlled rectifier device, with substrate 78 functioning as the P1 region, buried layer 22 functioning as the N2 region, body region 24 functioning as the P3 region and region 16 or 18 functioning as the N4 region. The functioning of the silicon controller rectifier device is described in further detail in application Ser. No. 12/533,661 filed Jul. 31, 2009 and titled "Methods of Operating Semiconductor Memory Device with Floating Body Transistor Using Silicon Controlled Rectifier Principle". Application Ser. No. 12/533,661 is hereby incorporated herein, in its entirety, by reference thereto. In this example, the substrate terminal 78 functions as the anode and terminal 72 or terminal 74 functions as the cathode, while body region 24 functions as a p-base to turn on the SCR device. If cell 50 is in a state "1" having holes in the body region 24, the silicon controlled rectifier (SCR) device formed by the substrate, buried well, floating body, and the BL junction will be turned on and a higher cell current is observed compared to when cell 50 is in a state "0" having no holes in body region 24. A positive voltage is applied to WL terminal 70 to select a row in the memory cell array 80 (e.g., see FIG. 13), while negative voltage is applied to WL terminal 70 for any unselected rows. The negative voltage applied reduces the potential of floating body 24 through capacitive coupling in the unselected rows and turns off the SCR device of each cell 50 in each unselected row. In one particular non-limiting embodiment, about +0.8 volts is applied to terminal 78, about +0.5 volts is applied to terminal 70 (for the selected row), and about 0.0 volts is applied to terminal 74. However, these voltage levels may vary.

Figure 4:
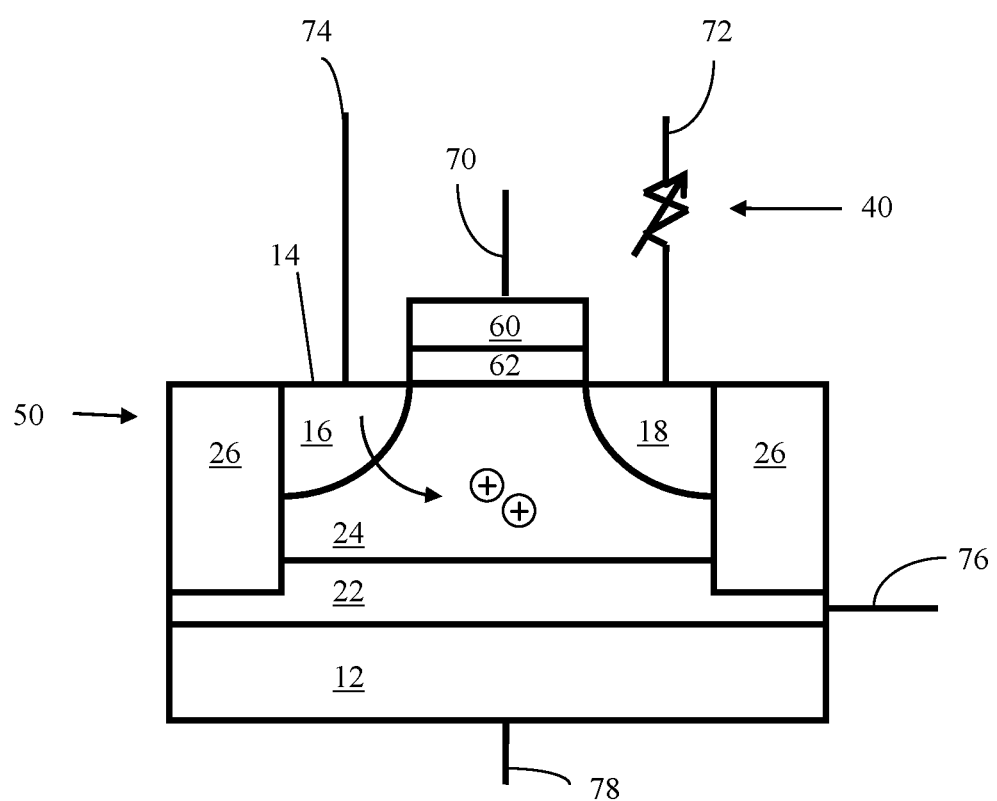
FIG. 4 is a schematic illustrating an operating condition for a write state "1" operation that can be carried out on a memory cell according to an embodiment of the present invention.

FIG. 4 illustrate write state "1" operations that can be carried out on cell 50, by performing band-to-band tunneling hot hole injection or impact ionization hot hole injection. To write state "1" using band-to-band tunneling mechanism, the following voltages are applied to the terminals: a positive voltage is applied to BL terminal 74, a substantially neutral voltage is applied to SL terminal 72, a negative voltage is applied to WL terminal 70, a positive voltage is applied to BW terminal 76, and a substantially neutral voltage is applied to the substrate terminal 78. Under these conditions, holes are injected from BL terminal 74 into the floating body region 24, leaving the body region 24 positively charged. In one particular non-limiting embodiment, a charge of about 0.0 volts is applied to terminal 72, a charge of about +2.0 volts is applied to terminal 74, a charge of about −1.2 volts is applied to terminal 70, a charge of about +0.6 volts is applied to terminal 76, and about 0.0 volts is applied to terminal 78. However, these voltage levels may vary, while maintaining the relative relationships between the voltages applied, as described above.

Alternatively, to write state "1" using an impact ionization mechanism, the following voltages can be applied to the terminals: a positive voltage is applied to BL terminal 74, a substantially neutral voltage is applied to SL terminal 72, a positive voltage is applied to WL terminal 70, a positive voltage less positive than the positive voltage applied to BL terminal 74 is applied to BW terminal 76, and a substantially neutral voltage is applied to the substrate terminal 78. Under these conditions, holes are injected from BL terminal 74 into the floating body region 24, leaving the body region 24 positively charged. In one particular non-limiting embodiment, +0.0 volts is applied to terminal 72, a charge of about +2.0 volts is applied to terminal 74, a charge of about +0.5 volts is applied to terminal 70, a charge of about +0.6 volts is applied to terminal 76, and about 0.0 volts is applied to terminal 78. However, these voltage levels may vary, while maintaining the relative relationships between the voltages applied, as described above.

In an alternate write state "1" using impact ionization mechanism, a positive bias can be applied to substrate terminal 78. The parasitic silicon controlled rectifier device of the selected cell is now turned off due to the negative potential between the substrate terminal 78 and the BL terminal 74. The functioning of the silicon controller rectifier device is described in further detail in application Ser. No. 12/533,661 filed Jul. 31, 2009 and titled "Methods of Operating Semiconductor Memory Device with Floating Body Transistor Using Silicon Controlled Rectifier Principle". Under these conditions, electrons will flow near the surface of the transistor, and generate holes through impact ionization mechanism. The holes are subsequently injected into the floating body region 24. In one particular non-limiting embodiment, +0.0 volts is applied to terminal 72, a charge of about +2.0 volts is applied to terminal 74, a charge of about +0.5 volts is applied to terminal 70, and about +0.8 volts is applied to terminal 78. However, these voltage levels may vary, while maintaining the relative relationships between the voltages applied, as described above.

Alternatively, the silicon controlled rectifier device of cell 50 can be put into a state "1" (i.e., by performing a write "1" operation) by applying the following bias: a neutral voltage is applied to BL terminal 74, a positive voltage is applied to WL terminal 70, and a positive voltage is applied to the substrate terminal 78, while SL terminal 72 and BW terminal 76 are left floating. The positive voltage applied to the WL terminal 70 will increase the potential of the floating body 24 through capacitive coupling and create a feedback process that turns the SCR device on. Once the SCR device of cell 50 is in conducting mode (i.e., has been "turned on") the SCR becomes "latched on" and the voltage applied to WL terminal 70 can be removed without affecting the "on" state of the SCR device. In one particular non-limiting embodiment, a voltage of about 0.0 volts is applied to terminal 74, a voltage of about +0.5 volts is applied to terminal 70, and about +3.0 volts is applied to terminal 78. However, these voltage levels may vary, while maintaining the relative relationships between the voltages applied, as described above, e.g., the voltage applied to terminal 78 remains greater than the voltage applied to terminal 74.

Figure 5:
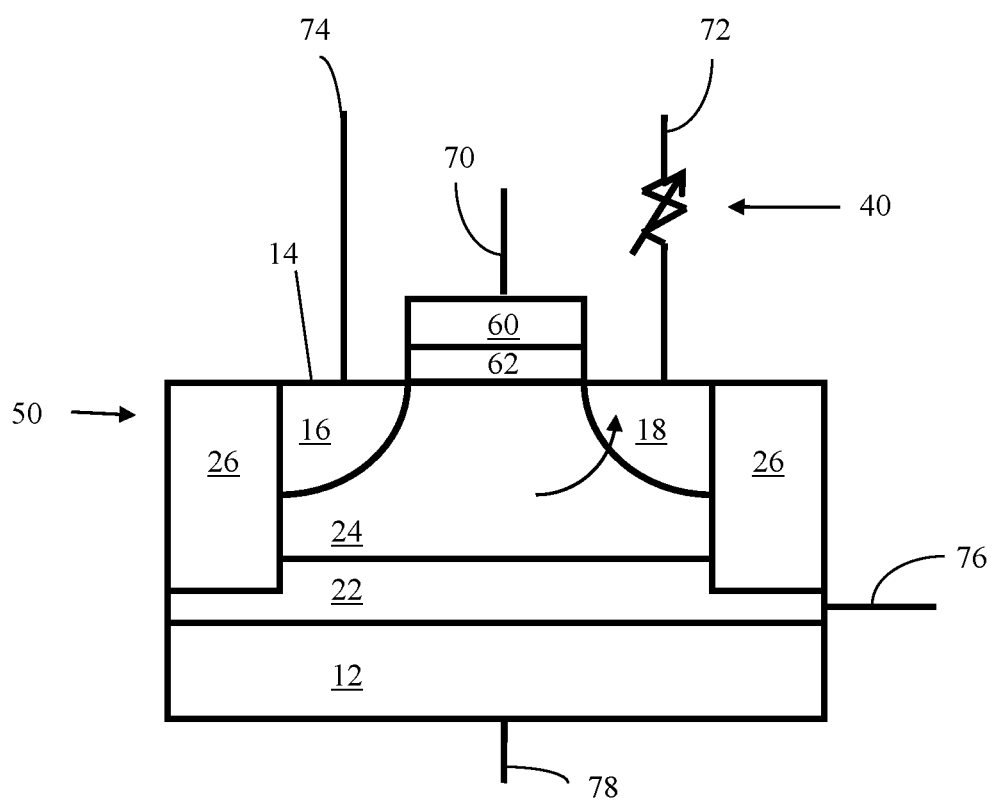
FIG. 5 illustrates an operating condition for a write state "0" operation that can be carried out on a memory cell according to an embodiment of the present invention.

A write "0" operation of the cell 50 is now described with reference to FIG. 5. To write "0" to cell 50, a negative bias is applied to SL terminal 72 and/or BL terminal 74, a neutral or negative voltage is applied to WL terminal 70, and a substantially neutral voltage is applied to substrate terminal 78. Under these conditions, the p-n junction (junction between 24 and 16 and between 24 and 18) is forward-biased, evacuating any holes from the floating body 24. In one particular non-limiting embodiment, about −1.0 volts is applied to terminal 72, about −1.0 volts is applied to terminal 70, and about 0.0 volts is applied to terminal 78. However, these voltage levels may vary, while maintaining the relative relationships between the voltages applied, as described above.

Alternatively, a write "0" operation can be performed to cell 50 by applying a positive bias to WL terminal 70, and substantially neutral voltages to SL terminal 72, BL terminal 74, and substrate terminal 78. Under these conditions, the holes will be evacuated from the floating body 24. In one particular non-limiting embodiment, about 1.0 volts is applied to terminal 70, about 0.0 volts are applied to terminals 72 and 74, and about 0.0 volts is applied to terminal 78. However, these voltage levels may vary, while maintaining the relative relationships between the voltages applied, as described above.

Alternatively, a write "0" operation can be performed by putting the silicon controlled rectifier device into the blocking mode. This can be performed by applying the following bias: a positive voltage is applied to BL terminal 74, a positive voltage is applied to WL terminal 70, and a positive voltage is applied to the substrate terminal 78, while leaving SL terminal 72 and BW terminal 76 floating. Under these conditions the voltage difference between anode and cathode, defined by the voltages at substrate terminal 78 and BL terminal 74, will become too small to maintain the SCR device in conducting mode. As a result, the SCR device of cell 50 will be turned off. In one particular non-limiting embodiment, a voltage of about +0.8 volts is applied to terminal 74, a voltage of about +0.5 volts is applied to terminal 70, and about +0.8 volts is applied to terminal 78. However, these voltage levels may vary, while maintaining the relative relationships between the charges applied, as described above.

Figure 6A:
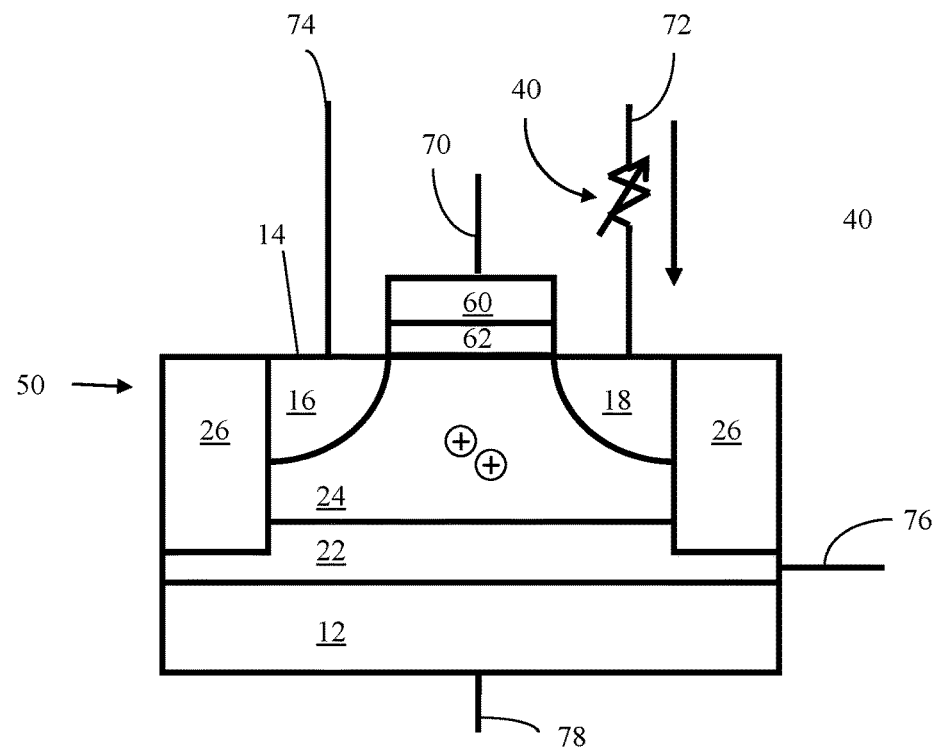
FIGS. 6A-6B schematically illustrate shadowing operations that can be carried out on a memory cell according to an embodiment of the present invention.
Figure 6B:
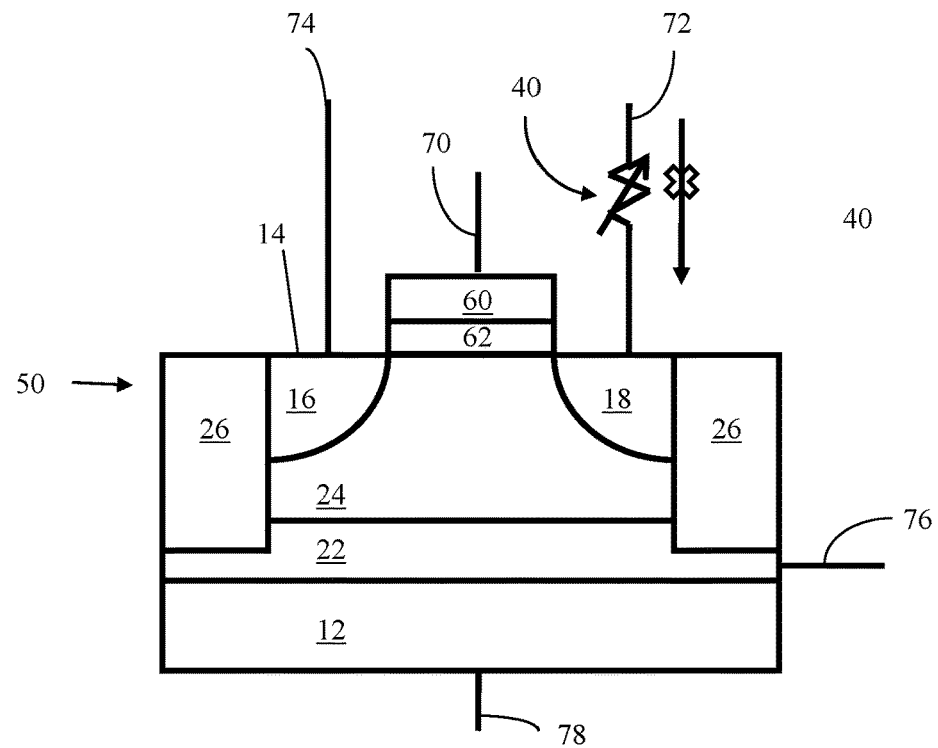

When power down is detected, e.g., when a user turns off the power to cell 50, or the power is inadvertently interrupted, or for any other reason, power is at least temporarily discontinued to cell 50, data stored in the floating body region 24 is transferred to the resistance change memory 40. This operation is referred to as "shadowing" and is described with reference to FIGS. 6A-6B.

To perform a shadowing process, a positive voltage is applied to terminal 72 and a substantially neutral voltage is applied to terminal 74. A neutral voltage or slightly positive voltage is applied terminal 70, a low positive voltage is applied to terminal 76, and a substantially neutral voltage is applied to terminal 78. These voltage levels can be driven by the appropriate circuitry controlling the memory cell array when the power shutdown is expected (such as during standby operation or when entering power savings mode) or from external capacitors in the event of abrupt and sudden power interruption.

When the floating body has a positive potential, the bipolar transistor formed by the SL terminal 72, floating body 24, and BL terminal 74 will be turned on. The positive voltage applied to terminal 72 is controlled (e.g., varied to maintain a constant current) such that the electrical current flowing through the resistance change memory 40 is sufficient to change the state of the materials from a low resistivity state to a high resistivity state. In the case of phase change materials, this involves the change of the crystallinity of the chalcogenide materials from crystalline state to amorphous state, while in metal oxide materials, this typically involves the annihilation of conductive filaments. Accordingly, the non-volatile resistance change material will be in a high resistivity state when the volatile memory of cell 50 is in state "1" (i.e. floating body 24 is positively charged).

When the floating body is neutral or negatively charged, the bipolar transistor formed by the SL terminal 72, floating body 24, and BL terminal 74 will be turned off. Therefore, when voltages are applied as described above, no electrical current will flow through the resistance change memory 40 and it will retain its low resistivity state. Accordingly, the non-volatile resistance change material will be in a low resistivity state when the volatile memory of cell 50 is in state "0" (i.e. floating body is neutral or negatively charged).

In one particular non-limiting example of this embodiment, about 0.0 volts is applied to terminal 72, a constant current of about 7001 µA is applied to terminal 74, about +1.0 volts is applied to terminal 70, about +0.6 volts is applied to terminal 76, and about 0.0 volts is applied to terminal 78. However, these voltage and current levels may vary, while maintaining the relative relationships between the charges applied, as described above. To change the non-volatile phase change memory from low resistivity state to high resistivity state, a current level between 600 µA and 1 mA can be used. Lower current will be needed as the phase change material is scaled to smaller geometry. The current levels employed in metal oxide systems vary greatly depending on the materials used, ranging from tens of microamperes to tens of milliamperes.

Note that this process occurs non-algorithmically, as the state of the floating body 24 does not have to be read, interpreted, or otherwise measured to determine what state to write the non-volatile resistance change memory 40 to. Rather, the shadowing process occurs automatically, driven by electrical potential differences. Accordingly, this process is orders of magnitude faster than one that requires algorithmic intervention.

Figure 7A:
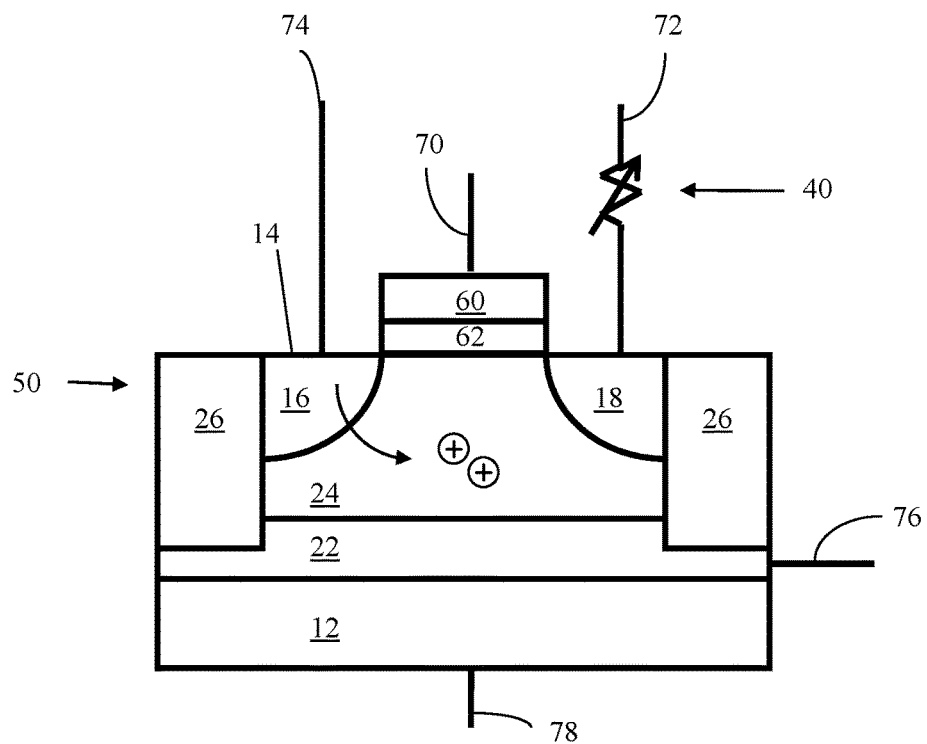
FIGS. 7A-7B schematically illustrate restore operations that can be carried out on a memory cell according to an embodiment of the present invention.
Figure 7B:
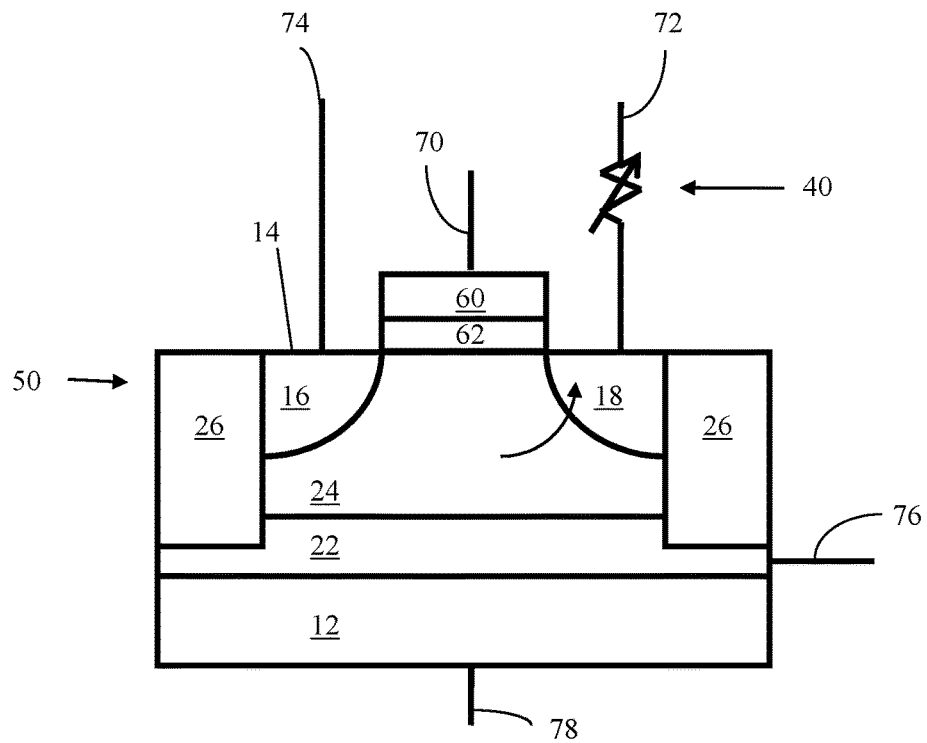

When power is restored to cell 50, the state of the cell 50 as stored on the non-volatile resistance change memory 40 is restored into floating body region 24. The restore operation (data restoration from non-volatile memory to volatile memory) is described with reference to FIGS. 7A-7B. In one embodiment, to perform the restore operation, a negative voltage is applied to terminal 70, a positive voltage is applied to terminal 74, a negative voltage is applied to terminal 72, a low positive voltage is applied to terminal 76, and a substantially neutral voltage is applied to terminal 78.

This condition will result in result in band-to-band tunneling hole injection into the floating body 24. However, if the resistance change memory is in low resistivity state, the negative voltage applied to terminal 72 will evacuate holes in the floating body 24 because the p-n junction formed by the floating body 24 and the region 18 is forward-biased. Consequently, the volatile memory state of memory cell 50 will be restored to state "0" upon completion of the restore operation, restoring the state that the memory cell 50 held prior to the shadowing operation.

If the resistance change memory 40 is in high resistivity state, no current flows through the resistance change memory 40, hence the holes accumulated in the floating body 24 will not be evacuated. As a result, the memory state "1" that the memory cell 50 held prior to the shadowing operation will be restored.

In one particular non-limiting example of this embodiment, about −1.0 volts is applied to terminal 72, about +2.0 volts is applied to terminal 74, about −1.2 volts is applied to terminal 70, about +0.6 volts is applied to terminal 76, and a neutral voltage is applied to the substrate terminal 78. However, these voltage levels may vary, while maintaining the relative relationships between the charges applied, as described above.

Note that this process occurs non-algorithmically, as the state of the non-volatile resistance change memory 40 does not have to be read, interpreted, or otherwise measured to determine what state to restore the floating body 24 to. Rather, the restoration process occurs automatically, driven by resistivity state differences. Accordingly, this process is orders of magnitude faster than one that requires algorithmic intervention.

Figure 8:
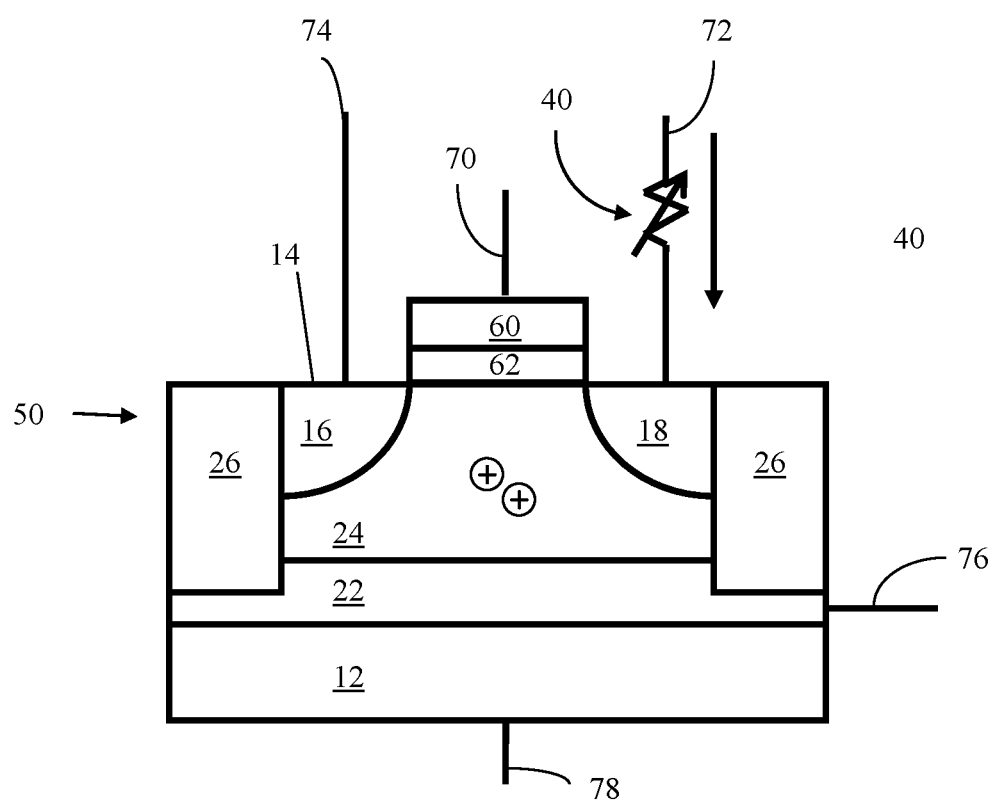
FIG. 8 schematically illustrates a reset operation that can be carried out on a memory cell according to an embodiment of the present invention.

After restoring the memory cell(s) 50, the resistance change memory(ies) 40 is/are reset to a predetermined state, e.g., a low resistivity state as illustrated in FIG. 8, so that each resistance change memory 40 has a known state prior to performing another shadowing operation.

To perform a reset operation according to the embodiment of FIG. 8, a neutral or slightly positive voltage is applied to terminal 70, a substantially neutral voltage is applied to BL terminal 74, a positive voltage is applied to SL terminal 72, a positive voltage is applied to terminal 76, and a neutral voltage is applied to substrate terminal 78.

When the floating body has a positive potential, the bipolar transistor formed by the SL terminal 72, floating body 24, and BL terminal 74 will be turned on. The positive voltage applied to terminal 72 is controlled (e.g., varied to maintain a constant current) such that the electrical current flowing through the resistance change memory 40 is sufficient to change the resistivity of the resistance change materials from a high resistivity state to a low resistivity state. The voltage applied to terminal 72 initially has to exceed a threshold value (sometimes referred to as 'dynamic threshold voltage') to ensure that all resistance change memory materials (including ones in high resistivity state) are conducting. Accordingly, all the non-volatile resistance change memory 40 will be in a low resistivity state upon completion of the reset operation.

In one particular non-limiting example of this embodiment, about 0.0 volts is applied to terminal 74, a constant current of about 400 µA is applied to terminal 72, about +1.0 volts is applied to terminal 70, and about +0.6 volts is applied to terminal 76. However, these voltage levels may vary, while maintaining the relative relationships between the charges applied, as described above. The dynamic threshold voltage of a phase change non-volatile memory is typically greater than 1.0 volts, upon which the high resistivity phase change materials will become conducting. The current level required to change phase change memory materials to low resistivity state typically range between 100 µA to 600 µA. For the case of metal oxide systems, the threshold voltage and the current level vary depending on the materials.

In another embodiment, the resistance change memory 40 is initialized to have a high resistivity state. When power is applied to cell 50, cell 50 operates like a capacitorless DRAM cell. In a capacitorless DRAM device, the memory information (i.e., data that is stored in memory) is stored as charge in the floating body of the transistor, i.e., in the body 24 of cell 50. The presence of the electrical charge in the floating body 24 modulates the threshold voltage of the cell 50, which determines the state of the cell 50.

A read operation can be performed on memory cell 50 through the following exemplary bias condition. A neutral voltage is applied to the substrate terminal 78, a neutral or positive voltage is applied to the BW terminal 76, a substantially neutral voltage is applied to SL terminal 72, a positive voltage is applied to BL terminal 74, and a positive voltage more positive than the voltage applied to BL terminal 74 is applied to WL terminal 70. If cell 50 is in a state "1" having holes in the body region 24, then a lower threshold voltage (gate voltage where the transistor is turned on) is observed compared to the threshold voltage observed when cell 50 is in a state "0" having no holes in body region 24. In one particular non-limiting embodiment, about 0.0 volts is applied to terminal 72, about +0.4 volts is applied to terminal 74, about +1.2 volts is applied to terminal 70, about +0.6 volts is applied to terminal 76, and about 0.0 volts is applied to terminal 78. However, these voltage levels may vary, while maintaining the relative relationships between the voltages applied, as described above.

Alternatively, a neutral voltage is applied to the substrate terminal 78, a neutral or positive voltage is applied to the BW terminal 76, a positive voltage is applied to BL terminal 74, and SL terminal 72 is left floating or grounded, and a neutral or positive voltage less positive than the positive voltage applied to BL terminal 74 is applied to WL terminal 70. If cell 50 is in a state "1" having holes in the body region 24, then the bipolar transistor formed by BL junction 16, floating body 24, and buried layer 22 is turned on. As a result, a higher cell current is observed compared to when cell 50 is in a state "0" having no holes in body region 24. In one particular non-limiting embodiment, terminal 72 is left floating, about +3.0 volts is applied to terminal 74, about +0.5 volts is applied to terminal 70, about +0.6 volts is applied to terminal 76, and about 0.0 volts is applied to terminal 78. However, these voltage levels may vary while maintaining the relative relationships between the voltages applied, as described above.

In another embodiment of the read operation that can be performed on memory cell 50, a positive voltage is applied to the substrate terminal 78, a neutral voltage is applied to BL terminal 74, SL terminal 72 is left floating or grounded, a neutral or positive voltage is applied to WL terminal 70, while BW terminal 76 is left floating. If cell 50 is in state "1" with the body region 24 positively charged, the silicon controlled rectifier (SCR) device formed by the substrate 12, buried well 22, floating body 24, and the BL junction 74 will be turned on and a higher cell current is observed compared to when cell 50 is in a state "0" with the body region 24 in neutral state or negatively charged. In one particular non-limiting embodiment, about +0.8 volts is applied to terminal 78, about +0.5 volts is applied to terminal 70, and about 0.0 volts is applied to terminal 74, while terminals 72 and 76 are left floating. However, these voltage levels may vary while maintaining the relative relationships between the voltages applied, as described above.

The following conditions describe a write state "1" operation that can be performed on memory cell 50, where the resistance change memory 40 is in a high resistivity state. To write state "1" using a band-to-band tunneling mechanism, the following voltages are applied to the terminals: a positive voltage is applied to BL terminal 74, SL terminal 72 is left floating or grounded, a negative voltage is applied to WL terminal 70, a neutral or positive voltage is applied to the BW terminal 76, and a neutral voltage is applied to the substrate terminal 78. Under these conditions, holes are injected from BL junction 16 into the floating body region 24, leaving the body region 24 positively charged. In one particular non-limiting embodiment, about +2.0 volts is applied to terminal 74, about −1.2 volts is applied to terminal 70, about +0.6 volts is applied to terminal 76, about 0.0 volts is applied to terminal 78, and terminal 72 is left floating. However, these voltage levels may vary while maintaining the relative relationships between the voltages applied, as described above.

Alternatively, to write state "1" using an impact ionization mechanism, the following voltages are applied to the terminals: a positive voltage is applied to BL terminal 74, SL terminal 72 is left floating or grounded, a positive voltage is applied to WL terminal 70, a neutral or positive voltage is applied to BW terminal 76, and a substantially neutral voltage is applied to the substrate terminal 78. Under these conditions, holes are injected from BL junction 16 into the floating body region 24, leaving the body region 24 positively charged. In one particular non-limiting embodiment, a potential of about +2.0 volts is applied to terminal 74, a potential of about +0.5 volts is applied to terminal 70, a potential of about +0.6 volts is applied to terminal 76, and about 0.0 volts is applied to terminal 78, while terminal 72 is left floating. However, these voltage levels may vary while maintaining the relative relationships between the voltages applied, as described above.

Alternatively, the silicon controlled rectifier device can be operated to put cell 50 into a state "1" by applying the following bias: a substantially neutral voltage is applied to BL terminal 74, a positive voltage is applied to WL terminal 70, and a positive voltage is applied to the substrate terminal 78, while SL terminal 72 and BW terminal 76 are left floating. The positive voltage applied to the WL terminal 70 will increase the potential of the floating body 24 through capacitive coupling and create a feedback process that turns the device on. In one particular non-limiting embodiment, a charge of about 0.0 volts is applied to terminal 74, a charge of about +0.5 volts is applied to terminal 70, and about +3.0 volts is applied to terminal 78. However, these voltage levels may vary while maintaining the relative relationships between the voltages applied, as described above.

A write "0" operation of the cell 50 is now described. To write "0" to cell 50, a negative bias is applied to BL terminal 74, SL terminal 72 is grounded or left floating, a neutral or negative voltage is applied to WL terminal 70, a neutral or positive voltage is applied to BW terminal 76, and a substantially neutral voltage is applied to substrate terminal 78. Under these conditions, the p-n junction (junction between 24 and 18) is forward-biased, evacuating any holes from the floating body 24. In one particular non-limiting embodiment, about −2.0 volts is applied to terminal 74, about −1.2 volts is applied to terminal 70, about 0.0 volts is applied to terminal 76, and about 0.0 volts is applied to terminal 78, while terminal 72 is grounded or left floating. However, these voltage levels may vary while maintaining the relative relationships between the voltages applied, as described above.

In an alternate write "0" operation, a neutral voltage is applied to BL terminal 74, a positive voltage is applied to WL terminal 70, a neutral or positive voltage is applied to BW terminal 76, a substantially neutral voltage is applied to substrate terminal 78, while terminal 72 is grounded or left floating. Under these conditions, holes from the floating body 24 are evacuated. In one particular non-limiting embodiment, about +1.5 volts is applied to terminal 70, about 0.0 volts is applied to terminal 74, about 0.0 volts is applied to terminal 76, about 0.0 volts is applied to terminal 78, while terminal 72 is grounded or left floating. However, these voltage levels may vary while maintaining the relative relationships between the voltages applied, as described above.

Alternatively, a write "0" operation can be performed by putting the silicon controlled rectifier device of cell 50 into the blocking mode. This can be performed by applying the following bias: a positive voltage is applied to BL terminal 74, a positive voltage is applied to WL terminal 70, and a positive voltage is applied to the substrate terminal 78, while leaving SL terminal 72 and BW terminal 76 floating. In one particular non-limiting embodiment, a charge of about +0.8 volts is applied to terminal 74, a charge of about +0.5 volts is applied to terminal 70, and about +0.8 volts is applied to terminal 78. However, these voltage levels may vary, while maintaining the relative relationships between the charges applied, as described above.

To perform a shadowing process on memory cell 50, a positive voltage is applied to terminal 72 and a substantially neutral voltage is applied to terminal 74. A neutral voltage or positive voltage is applied terminal 70 and a low positive voltage is applied to terminal 76, while the substrate terminal 78 is grounded.

When the floating body has a positive potential, the bipolar transistor formed by the SL terminal 72, floating body 24, and BL terminal 74 and/or BW terminal 76 will be turned on. The positive voltage applied to terminal 72 is controlled (e.g., varied to maintain a constant current) such that the electrical current flowing through the resistance change memory 40 is sufficient to change the resistivity of the materials from a high resistivity state to a low resistivity state. The voltage applied to terminal 72 initially has to exceed the dynamic threshold voltage (typically larger than 1.0 volts) to ensure that the resistance change memory 40 (even if it is in high resistivity state) will be conducting. Accordingly, the non-volatile resistance change material will be in a low resistivity state when the volatile memory of cell 50 is in state "1" (i.e. floating body 24 is positively charged).

When the floating body is neutral or negatively charged, the bipolar transistor formed by the SL terminal 72, floating body 24, and BL terminal 74 and/or BW terminal 76 will be turned off. Therefore, when voltages are applied as described above, no electrical current will flow through the resistance change memory 40 and it will retain its high resistivity state. Accordingly, the non-volatile resistance change material will be in a high resistivity state when the volatile memory of cell 50 is in state "0" (i.e. floating body is neutral or negatively charged).

In one particular non-limiting example of this embodiment, about 0.0 volts is applied to terminal 74, a constant current of about 400 µA is applied to terminal 72, about +1.0 volts is applied to terminal 70, about +0.6 volts is applied to terminal 76, and about 0.0 volts is applied to terminal 78. However, these voltage and current levels may vary, while maintaining the relative relationships between the charges applied, as described above. The current level required to change phase change memory materials to low resistivity state typically range between 100 µA to 600 µA, while that of metal oxide systems vary depending on the materials. The current level is expected to decrease as the resistance change material is scaled to smaller geometry.

In another embodiment, the following bias can be applied: a neutral voltage is applied to terminal 72, a neutral voltage or positive voltage is applied to terminal 70, a positive voltage is applied to terminal 78, while terminals 74 and 76 are left floating. When the floating body 24 has a positive potential, the silicon controlled rectifier device formed by the SL 72 junction, floating body 24, buried layer 22, and substrate 12 will be turned on. The positive voltage applied to terminal 78 is controlled (e.g., varied to maintain a constant current) such that the electrical current flowing through the resistance change memory 40 is sufficient to change the resistivity of the materials from a high resistivity state to a low resistivity state. For phase change materials, the crystalline state changes from amorphous phase to crystalline phase, while in metal oxide systems, this typically involves the formation of conductive filaments. Accordingly, the non-volatile resistance change material will be in a low resistivity state when the volatile memory of cell 50 is in state "1" (i.e. floating body 24 is positively charged).

When the floating body 24 is neutral or negatively charged, the silicon controlled rectifier device will be turned off. Therefore, no electrical current flows through the resistance change memory 40 and it will retain its high resistivity state. Accordingly, the non-volatile resistance change material will be in a high resistivity state when the volatile memory of cell 50 is in state "0" (i.e. floating body 24 is neutral or negatively charged).

In one particular non-limiting example of this embodiment, about 0.0 volts is applied to terminal 72, a constant current of about 400 µA is applied to terminal 78, about +1.0 volts is applied to terminal 70, while terminals 74 and 76 are left floating. However, these voltage levels may vary while maintaining the relative relationships between the voltages applied, as described above. The current level required to change phase change memory materials to low resistivity state typically range between 100 µA to 600 µA and is expected to decrease as the phase change memory is being scaled to smaller dimension. In metal oxide systems, it varies depending on the materials used.

The restore operation (data restoration from non-volatile memory to volatile memory) is now described. In one embodiment, to perform the restore operation, a negative voltage is applied to terminal 70, a positive voltage is applied to terminal 72, a neutral voltage is applied to terminal 74, a neutral or low positive voltage is applied to terminal 76, and a substantially neutral voltage is applied to terminal 78.

If the resistance change memory 40 is in low resistivity state, this condition will result in holes being injected into the floating body 24, generated through the band-to-band tunneling mechanism, thereby restoring the state "1" that the memory cell 50 held prior to the shadowing operation. If the resistance change memory 40 is in high resistivity state, no holes will be generated; consequently, the volatile memory state of memory cell 50 will be restored to state "0". Upon completion of the restore operation, the volatile memory of cell 50 is restored to the state that the volatile memory of memory cell 50 held prior to the shadowing operation.

In one particular non-limiting example of this embodiment, about +2.0 volts is applied to terminal 72, about +0.0 volts is applied to terminal 74, about −1.2 volts is applied to terminal 70, about 0.0 volts is applied to terminal 76, and about 0.0 volts is applied to terminal 78. However, these voltage levels may vary, while maintaining the relative relationships between the charges applied, as described above.

In another embodiment of the restore operation, the following bias can be applied: a neutral voltage is applied to terminal 72, a positive voltage is applied to terminal 70, a positive voltage is applied to terminal 78, while terminals 74 and 76 are left floating. The positive voltage applied to the WL terminal 70 will increase the potential of the floating body 24 through capacitive coupling. If the resistance change memory 40 is in a low resistivity state, this will create a feedback process that latches the device on and the volatile state of the memory cell 50 will be in state "1". If the resistance change memory 40 is in a high resistivity state, the volatile state of the memory cell 50 will remain in state "0". In one particular non-limiting embodiment, a charge of about 0.0 volts is applied to terminal 72, a charge of about +0.5 volts is applied to terminal 70, about +0.8 volts is applied to terminal 78, while terminals 74 and 76 are left floating. However, these voltage levels may vary while maintaining the relative relationships between the voltages applied, as described above.

After restoring the memory cell(s) 50, the resistance change memory 40 is/are reset to a high resistivity state, so that each resistance change memory 40 has a known state prior to performing another shadowing operation.

To perform a reset operation according to the embodiment, a neutral voltage or positive voltage is applied to terminal 70, a substantially neutral voltage is applied to BL terminal 74, a positive voltage is applied to SL terminal 72, a neutral or positive voltage is applied to terminal 76, and a substantially neutral voltage is applied to terminal 78.

When the floating body 24 has a positive potential, the bipolar transistor formed by the SL terminal 72, floating body 24, and BL terminal 74 and/or BW terminal 76 will be turned on. The positive voltage applied to terminal 72 is controlled (e.g., varied to maintain a constant current) such that the electrical current flowing through the resistance change memory 40 is sufficient to change the resistivity of the materials from a low resistivity state to a high resistivity state. Accordingly, all the non-volatile resistance change memory 40 will be in a high resistivity state upon completion of the reset operation.

In one particular non-limiting example of this embodiment, about 0.0 volts is applied to terminal 74, a constant current of about 700 μA is applied to terminal 72, about +1.0 volts is applied to terminal 70, about +0.6 volts is applied to terminal 76, and about 0.0 volts is applied to terminal 78. However, these voltage levels may vary, while maintaining the relative relationships between the charges applied, as described above. To change the non-volatile phase change memory from low resistivity state to high resistivity state, a current level between 600 μA and 1 mA can be used. Lower current will be needed as the phase change material is scaled to smaller geometry.

In an alternative embodiment of the reset operation, the following bias can be applied: a neutral voltage is applied to terminal 72, a neutral voltage or positive voltage is applied to terminal 70, a positive voltage is applied to terminal 78, while terminals 74 and 76 are left floating.

When the floating body 24 has a positive potential, the silicon controlled rectifier device formed by the SL 72 junction, floating body 24, buried layer 22, and substrate 12 will be turned on. The positive voltage applied to terminal 78 is controlled (e.g., varied to maintain a constant current) such that the electrical current flowing through the resistance change memory 40 is sufficient to change the resistivity of the materials from a low resistivity state to a high resistivity state. Accordingly, the non-volatile resistance change material will be in a high resistivity state upon completion of the reset operation.

In one particular non-limiting example of this embodiment, about 0.0 volts is applied to terminal 72, a constant current of about 700 μA is applied to terminal 78, about +1.0 volts is applied to terminal 70, while terminals 74 and 76 are left floating. However, these voltage levels may vary while maintaining the relative relationships between the voltages applied, as described above. To change the non-volatile phase change memory from low resistivity state to high resistivity state, a current level between 600 μA and 1 mA can be used. Lower current will be needed as the phase change material is scaled to smaller geometry.

Figure 14:
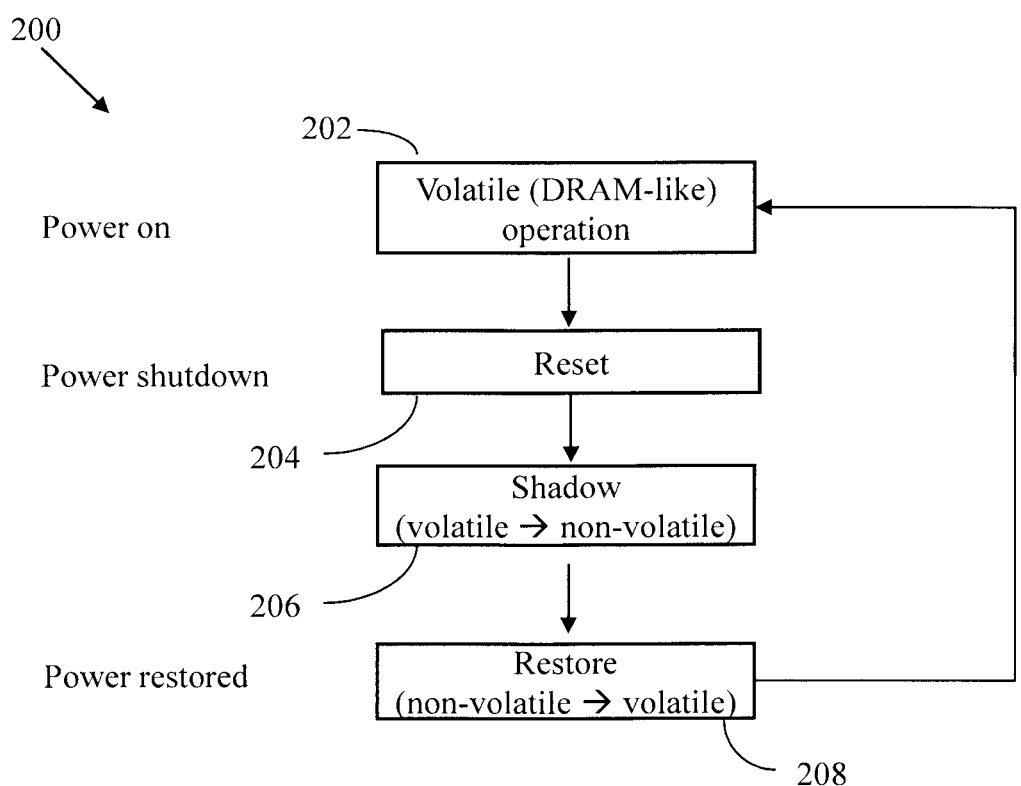
FIG. 14 is a flowchart illustrating operation of a memory device according to another embodiment of the present invention.

In this embodiment of the memory cell operations, the volatile memory operations can be performed in the same manner regardless of the state of the resistance change memory, i.e. there is no interference from the non-volatile memory state to the volatile memory operations. An alternative embodiment of the memory cell operations is described in flowchart 200 in FIG. 14. At event 202, when power is applied to the memory device, the memory device can be operated without the non-volatile memory of the device being set to a predetermined known state. The memory device may operate in the same manner as a volatile memory cell upon restore operation 208. As a result, the memory cell 50 can operate into the volatile operation mode faster, without first resetting the non-volatile memory state. The reset operation 204 can be performed just prior to writing new data into the non-volatile memory cell during the shadowing operation 206. In an alternative embodiment, the volatile and non-volatile memory can be configured to store different data, for example when the non-volatile memory is being used to store "permanent data", which does not change in value during routine use. For example, this includes operating system image, applications, multimedia files, etc. The volatile memory can be used to store state variable. In this embodiment, the reset operation 204 can be bypassed.

Figure 9A:
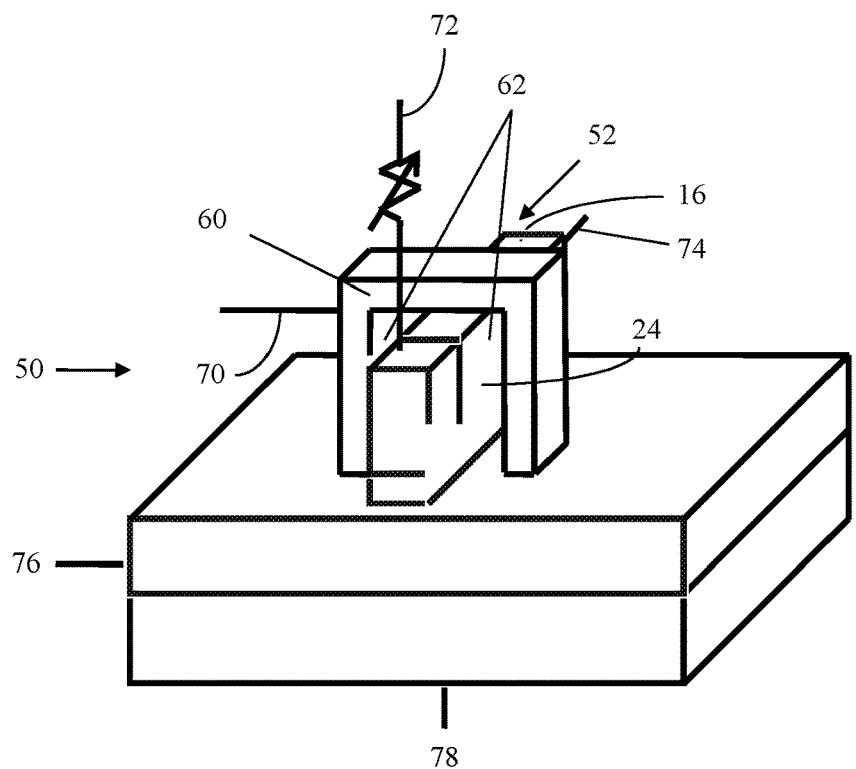
FIG. 9A is a perspective, cross-sectional, schematic illustration of a fin-type memory cell device according to an embodiment of the present invention.
Figure 9B:
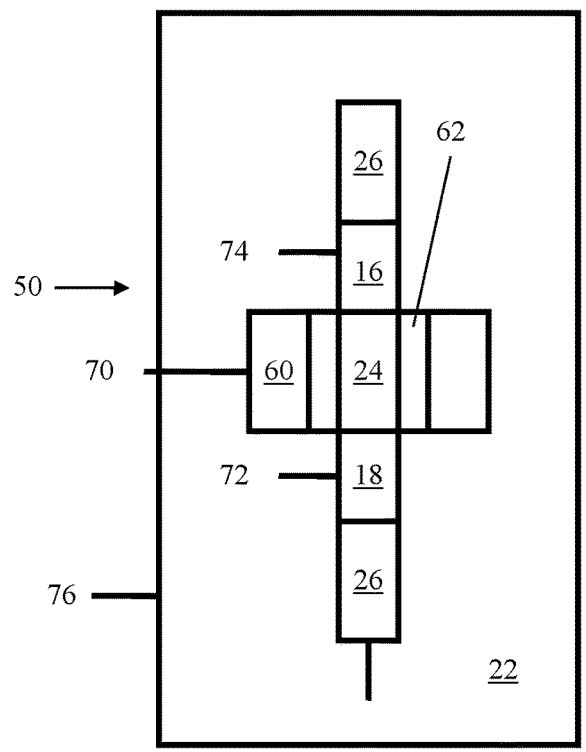
FIG. 9B is a top view schematic illustration of a fin-type memory cell device according to an embodiment of the present invention.

FIGS. 9A-9B show another embodiment (perspective, cross-sectional view and top view, respectively) of the memory cell 50 described in this invention. In this embodiment, cell 50 has a fin structure 52 fabricated on substrate 12, so as to extend from the surface of the substrate to form a three-dimensional structure, with fin 52 extending substantially perpendicularly to, and above the top surface of the substrate 12. Fin structure 52 is conductive and is built on buried well layer 22. Buried well layer 22 is also formed by an ion implantation process on the material of substrate 12. Buried well layer 22 insulates the floating substrate region 24, which has a first conductivity type, from the bulk substrate 12. Fin structure 52 includes first and second regions 16, 18 having a second conductivity type. Thus, the floating body region 24 is bounded by the top surface of the fin 52, the first and second regions 16, 18 the buried well layer 22, and insulating layers 26. Insulating layers 26 insulate cell 50 from neighboring cells 50 when multiple cells 50 are joined to make a memory device. Fin 52 is typically made of silicon, but may comprise germanium, silicon germanium, gallium arsenide, carbon nanotubes, or other semiconductor materials known in the art.

Device 50 further includes gates 60 on three sides of the floating substrate region 24 as shown in FIG. 9. Alternatively, gates 60 can enclose two opposite sides of the floating substrate region 24. Gates 60 are insulated from floating body 24 by insulating layers 62. Gates 60 are positioned between the first and second regions 16, 18, adjacent to the floating body 24.

A resistance change memory element 40 is positioned above the region having second conductivity type. The resistance change memory element 40 is shown as a variable resistor, and may be formed from resistance change memory element known in the art. In one embodiment, the non-volatile memory is initialized to have a low resistance state.

In another alternate embodiment, the non-volatile memory is initialized to have a high resistance state.

Cell 50 includes several terminals: word line (WL) terminal 70, source line (SL) terminal 72, bit line (BL) terminal 74, buried well (BW) terminal 76 and substrate terminal 78. Terminal 70 is connected to the gate 60. Terminal 74 is connected to first region 16 and terminal 72 is connected to resistance change memory element 40, which is, in turn, connected to second region 18. Alternatively, terminal 74 can be connected to resistance change memory element 40 and terminal 72 can be connected to first region 16. Terminal 76 is connected to buried layer 22 and terminal 78 is connected to substrate 12.

The operations of the embodiment of memory cell 50 shown in FIGS. 9A-9B are the same as those described above with regard to the embodiment of memory cell 50 of FIG. 2. Equivalent terminals have been assigned with the same numbering labels in both figures.

Figure 10:
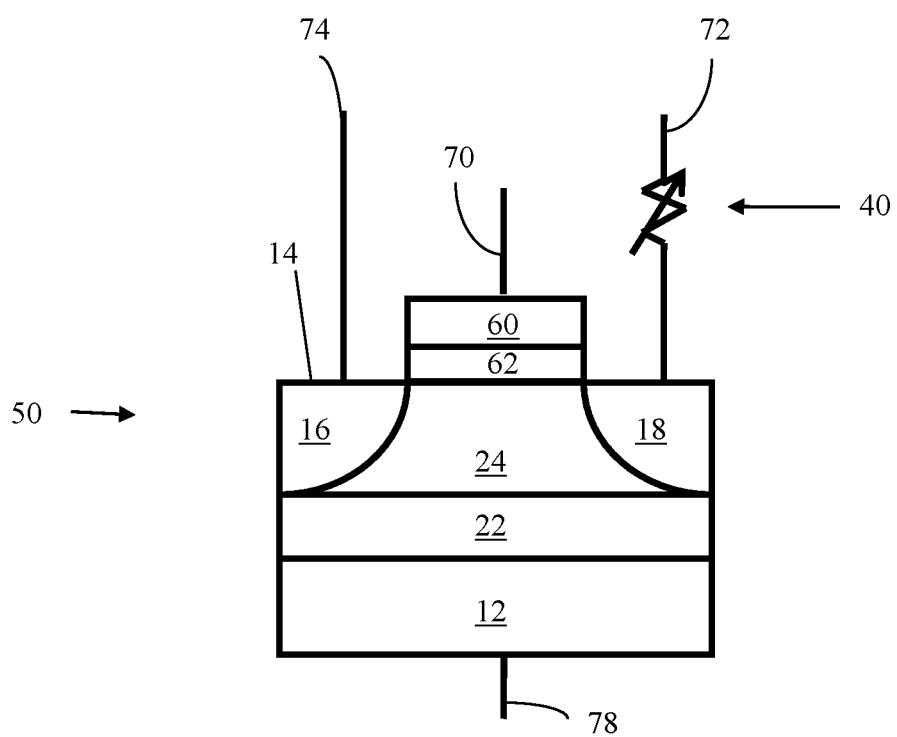
FIG. 10 is a cross-sectional, schematic illustration of a memory cell according to another embodiment of the present invention.

FIG. 10 illustrates another embodiment of the memory cell 50 fabricated on a silicon-on-insulator (SOI) substrate. The cell 50 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and which is exposed at surface 14. A second region 18 having the second conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art. A buried insulator layer 22 insulates the body region 24 from the substrate 12. The body region 24 is bounded by surface 14, first and second regions 16 and 18, and the buried insulator layer 22. The buried insulator layer 22 may be buried oxide (BOX).

A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

A resistance change memory element 40 is positioned above the region having second conductivity type 16. The resistance change memory element 40 is shown as a variable resistor, and may be formed from phase change material or metal-insulator-metal systems as described in previous embodiments above.

Cell 50 includes several terminals: word line (WL) terminal 70, source line (SL) terminal 72, bit line (BL) terminal 74, and substrate terminal 78. Terminal 70 is connected to the gate 60. Terminal 74 is connected to first region 16 and terminal 72 is connected to resistance change memory element 40 which is connected to second region 18. Alternatively, terminal 74 can be connected to resistance change memory element 40 and terminal 72 can be connected to first region 16. Terminal 78 is connected to substrate 12.

When power is applied to cell 50, cell 50 operates like a capacitorless DRAM cell. In a capacitorless DRAM device, the memory information (i.e., data that is stored in memory of the cells) is stored as charge in the floating bodies 24 of the transistors, i.e., in the bodies 24 of cells 50. The presence of the electrical charge in the floating body 24 modulates the threshold voltage of the cell 50, which determines the state of the cell 50. In one embodiment, the non-volatile memory is initialized to have a low resistance state.

To perform a read operation on memory cell 50 according to one embodiment of the present invention, a neutral or negative voltage is applied to the substrate terminal 78, a substantially neutral voltage is applied to SL terminal 72, a positive voltage is applied to BL terminal 74, and a positive voltage more positive than the positive voltage applied to BL terminal 74 is applied to WL terminal 70. If cell 50 is in a state "1" having holes in the body region 24, then a lower threshold voltage (gate voltage where the transistor is turned on) is observed compared to the threshold voltage observed when cell 50 is in a state "0" having substantially no holes in body region 24. In one particular non-limiting embodiment, about 0.0 volts is applied to terminal 72, about +0.4 volts is applied to terminal 74, about +1.2 volts is applied to terminal 70, and about −2.0 volts is applied to terminal 78. However, these voltage levels may vary while maintaining the relative relationships between the voltages applied, as described above.

Alternatively, a neutral or negative voltage is applied to the substrate terminal 78, a substantially neutral voltage is applied to SL terminal 72, a positive voltage is applied to BL terminal 74, and a positive voltage less positive than the positive voltage applied to BL terminal 74 is applied to WL terminal 70. If cell 50 is in a state "1" having holes in the body region 24, then the parasitic bipolar transistor formed by the SL terminal 72, floating body 24, and BL terminal 74 will be turned on and a higher cell current is observed compared to when cell 50 is in a state "0" having no holes in body region 24. In one particular non-limiting embodiment, about 0.0 volts is applied to terminal 72, about +3.0 volts is applied to terminal 74, about +0.5 volts is applied to terminal 70, and about −2.0 volts is applied to terminal 78. However, these voltage levels may vary while maintaining the relative relationships between the voltages applied, as described above.

A write state "1" operation can be carried out on cell 50 by performing band-to-band tunneling hot hole injection or impact ionization hot hole injection. To write state "1" using band-to-band tunneling mechanism, the following voltages are applied to the terminals: a positive voltage is applied to BL terminal 74, a substantially neutral voltage is applied to SL terminal 72, a negative voltage is applied to WL terminal 70, a neutral or negative voltage is applied to the substrate terminal 78. Under these conditions, holes are injected from BL terminal 74 into the floating body region 24, leaving the body region 24 positively charged. In one particular non-limiting embodiment, a charge of about 0.0 volts is applied to terminal 72, a potential of about +2.0 volts is applied to terminal 74, a potential of about −1.2 volts is applied to terminal 70, and about −2.0 volts is applied to terminal 78. However, these voltage levels may vary while maintaining the relative relationships between the voltages applied, as described above.

Alternatively, to write state "1" using an impact ionization mechanism, the following voltages are applied to the terminals: a positive voltage is applied to BL terminal 74, a substantially neutral voltage is applied to SL terminal 72, a positive voltage is applied to WL terminal 70, and a neutral or negative voltage is applied to the substrate terminal 78. Under these conditions, holes are injected from the region 16 into the floating body region 24, leaving the body region 24 positively charged. In one particular non-limiting embodiment, +0.0 volts is applied to terminal 72, a potential of about +2.0 volts is applied to terminal 74, a potential of about +0.5 volts is applied to terminal 70, and about −2.0 volts is applied to terminal 78. However, these voltage levels may vary while maintaining the relative relationships between the voltages applied, as described above.

A write "0" operation of the cell 50 is now described. To write "0" to cell 50, a negative bias is applied to SL terminal 72 and/or BL terminal 74, a neutral or negative voltage is applied to WL terminal 70, and a neutral or negative voltage is applied to substrate terminal 78. Under these conditions, the p-n junction (junction between 24 and 16 and between 24 and 18) is forward-biased, evacuating any holes from the floating body 24. In one particular non-limiting embodiment, about −1.0 volts is applied to terminal 72, about −1.0 volts is applied to terminal 70, and about 0.0 volts is applied to terminal 78. However, these voltage levels may vary, while maintaining the relative relationships between the voltages applied, as described above.

Alternatively, a write "0" operation can be performed to cell 50 by applying a positive bias to WL terminal 70, and substantially neutral voltages to SL terminal 72 and BL terminal 74, and a neutral or negative voltage to substrate terminal 78. Under these conditions, the holes will be removed from the floating body 24 through charge recombination. In one particular non-limiting embodiment, about 1.0 volts is applied to terminal 70, about 0.0 volts are applied to terminals 72 and 74, and about −2.0 volts is applied to terminal 78. However, these voltage levels may vary, while maintaining the relative relationships between the charges applied, as described above.

To perform a shadowing process, a positive voltage is applied to terminal 72 and a substantially neutral voltage is applied to terminal 74. A neutral voltage or positive voltage is applied terminal 70 and a neutral or negative voltage is applied to terminal 78.

When the floating body has a positive potential, the bipolar transistor formed by the SL terminal 72, floating body 24, and BL terminal 74 will be turned on. The positive voltage applied to terminal 72 is controlled (e.g., varied to maintain a constant current) such that the electrical current flowing through the resistance change memory 40 is sufficient to change the resistivity of the materials from a low resistivity state to a high resistivity state. Accordingly, the non-volatile resistance change material will be in a high resistivity state when the volatile memory of cell 50 is in state "1" (i.e. floating body 24 is positively charged).

When the floating body is neutral or negatively charged, the bipolar transistor formed by the SL terminal 72, floating body 24, and BL terminal 74 will be turned off. Therefore, when voltages are applied as described above, no electrical current will flow through the resistance change memory 40 and it will retain its low resistivity state. Accordingly, the non-volatile resistance change material will be in a low resistivity state when the volatile memory of cell 50 is in state "0" (i.e. floating body is neutral or negatively charged).

In one particular non-limiting example of this embodiment, about 0.0 volts is applied to terminal 74, about 700 µA is applied to terminal 72, about +1.0 volts is applied to terminal 70, and about −2.0 volts is applied to terminal 78. However, these voltage levels may vary, while maintaining the relative relationships between the charges applied, as described above. To change the non-volatile phase change memory from low resistivity state to high resistivity state, a current level between 600 µA and 1 mA can be used. The current level is expected to decrease as the phase change material is scaled to smaller geometry.

Note that this process occurs non-algorithmically, as the state of the floating body 24 does not have to be read, interpreted, or otherwise measured to determine what state to write the non-volatile resistance change memory 40 to. Rather, the shadowing process occurs automatically, driven by electrical potential differences. Accordingly, this process is orders of magnitude faster than one that requires algorithmic intervention.

When power is restored to cell 50, the state of the cell 50 as stored on the non-volatile resistance change memory 40 is restored into floating body region 24. In one embodiment, to perform the restore operation, a negative voltage is applied to terminal 70, a positive voltage is applied to terminal 74, a negative voltage is applied to terminal 72, and a neutral or negative voltage is applied to terminal 78.

If the resistance change memory 40 is in high resistivity state, this condition will result in holes injection into the floating body 24, generated through the band-to-band tunneling mechanism, thereby restoring the state "1" that the memory cell 50 held prior to the shadowing operation.

If the resistance change memory 40 is in low resistivity state, the negative voltage applied to terminal 72 will evacuate holes injected into the floating body 24 because the p-n junction formed by the floating body 24 and the region 16 is forward-biased. Consequently, the volatile memory state of memory cell 50 will be restored to state "0" upon completion of the restore operation, restoring the state that the memory cell 50 held prior to the shadowing operation.

In one particular non-limiting example of this embodiment, about −1.0 volts is applied to terminal 72, about +2.0 volts is applied to terminal 74, about −1.2 volts is applied to terminal 70, and about −2.0 volts is applied to terminal 78. However, these voltage levels may vary, while maintaining the relative relationships between the charges applied, as described above.

Note that this process occurs non-algorithmically, as the state of the non-volatile resistance change memory 40 does not have to be read, interpreted, or otherwise measured to determine what state to restore the floating body 24 to. Rather, the restoration process occurs automatically, driven by resistivity state differences. Accordingly, this process is orders of magnitude faster than one that requires algorithmic intervention.

After restoring the memory cell(s) 50, the resistance change memory 40 is/are reset to a predetermined state, e.g., a low resistivity state, so that each resistance change memory 40 has a known state prior to performing another shadowing operation.

To perform a reset operation according to the present embodiment, a neutral voltage or positive voltage is applied to terminal 70, a substantially neutral voltage is applied to BL terminal 74, a positive voltage is applied to SL terminal 72, and a neutral or negative voltage is applied to terminal 78.

When the floating body has a positive potential, the bipolar transistor formed by the SL terminal 72, floating body 24, and BL terminal 74 will be turned on. The positive voltage applied to terminal 72 is optimized such that the electrical current flowing through the resistance change memory 40 is sufficient to change the resistivity of the materials from a high resistivity state to a low resistivity state. Accordingly, all the non-volatile resistance change memory 40 will be in a low resistivity state upon completion of the reset operation.

In one particular non-limiting example of this embodiment, about 0.0 volts is applied to terminal 74, about 400 µA is applied to terminal 72, about −1.0 volts is applied to terminal 70, and about −2.0 volts is applied to terminal 78. However, these voltage levels may vary, while maintaining the relative relationships between the charges applied, as described above. The current level required to change phase change memory materials to low resistivity state typically range between 100 µA to 600 µA. The current level requirement is expected to decrease as the phase change memory dimension is reduced.

Figure 11:
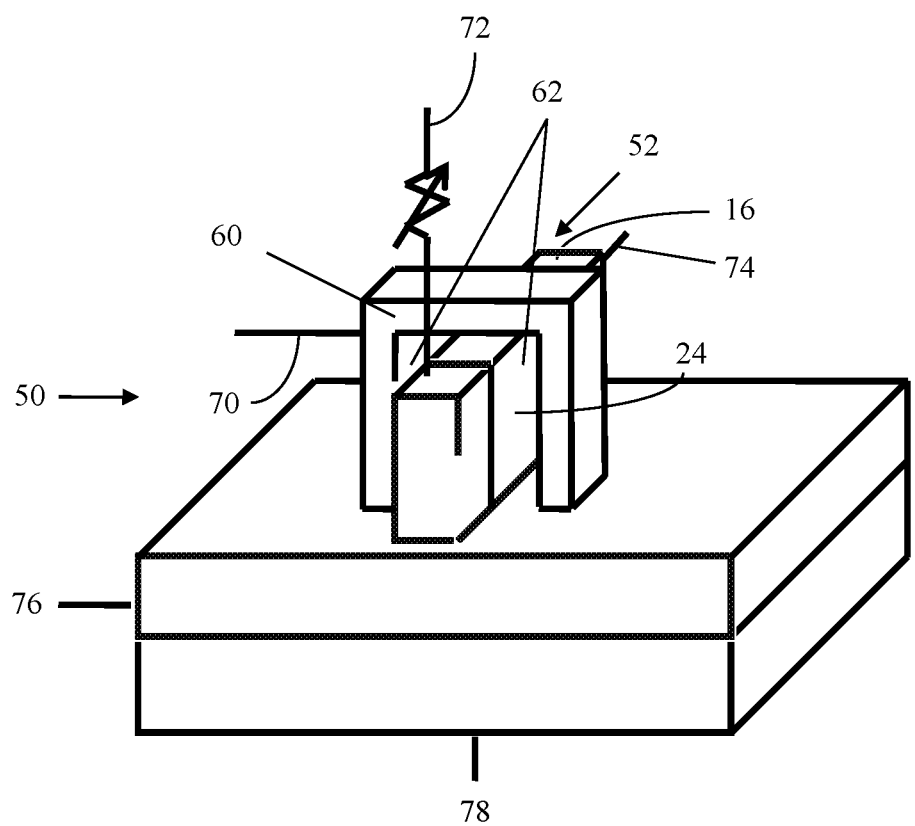
FIG. 11 is a cross-sectional, schematic illustration of a fin-type memory cell device according to another embodiment of the present invention.

FIG. 11 illustrates an alternative embodiment of a memory cell 50 according to the present invention. In this embodiment, cell 50 has a fin structure 52 fabricated on a silicon-on-insulator (SOI) substrate 12, so as to extend from the surface of the substrate to form a three-dimensional structure, with fin 52 extending substantially perpendicularly to, and above the top surface of the substrate 12. Fin structure 52 is conductive and is built on buried insulator layer 22, which may be buried oxide (BOX). Insulator layer 22 insulates the floating substrate region 24, which has a first conductivity type, from the bulk substrate 12. Fin structure 52 includes first and second regions 16, 18 having a second conductivity type. Thus, the floating body region 24 is bounded by the top surface of the fin 52, the first and second regions 16, 18 and the buried insulator layer 22. Fin 52 is typically made of silicon, but may comprise germanium, silicon germanium, gallium arsenide, carbon nanotubes, or other semiconductor materials known in the art.

Device 50 further includes gates 60 on three sides of the floating substrate region 24, as shown in FIG. 11. Alternatively, gates 60 can enclose two opposite sides of the floating substrate region 24. Gates 60 are insulated from floating body 24 by insulating layers 62. Gates 60 are positioned between the first and second regions 16, 18, adjacent to the floating body 24.

A resistance change memory element 40 is positioned above the region having second conductivity type. The resistance change memory element 40 is shown as a variable resistor, and may be formed from phase change material or metal-insulator-metal systems, for example. In one embodiment, the non-volatile memory is initialized to have a low resistance state. In another alternate embodiment, the non-volatile memory is initialized to have a high resistance state.

Cell 50 includes several terminals: word line (WL) terminal 70, source line (SL) terminal 72, bit line (BL) terminal 74, and substrate terminal 78. Terminal 70 is connected to the gate 60. Terminal 74 is connected to first region 16 and terminal 72 is connected to resistance change memory element 40 which is connected to second region 18. Alternatively, terminal 74 can be connected to resistance change memory element 40 and terminal 72 can be connected to first region 16. The bulk substrate 12 is connected to terminal 78.

Cell 50 includes four terminals: word line (WL) terminal 70, source line (SL) terminal 72, bit line (BL) terminal 74 and substrate terminal 78. Gate 60 is connected to terminal 70, first and second regions 16, 18 are connected to terminals 74 and 72, respectively, or vice versa, and the bulk substrate 12 is connected to terminal 78.

The operations of the embodiment of memory cell 50 shown in FIG. 11 are the same as for memory cell 50 described in FIG. 10. Equivalent terminals have been assigned with the same numbering labels in both figures.

Figure 12:
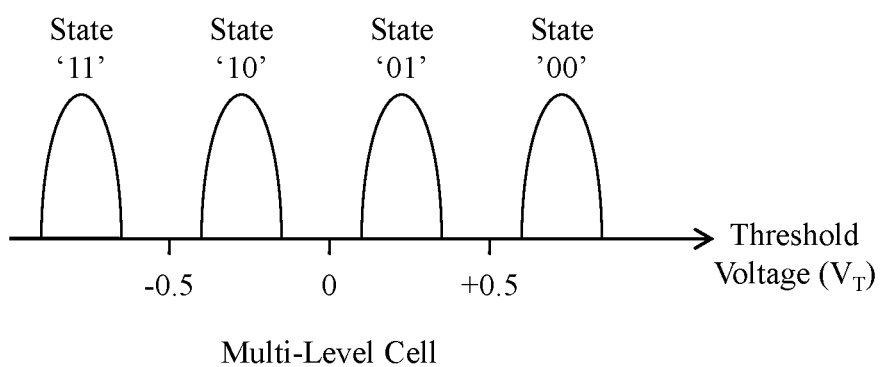
FIG. 12 illustrates various states of a multi-level cell according to an embodiment of the present invention.

Up until this point, the description of cells 50 have been in regard to binary cells, in which the data memories, both volatile and non-volatile, are binary, meaning that they either store state "1" or state "0". However, in an alternative embodiment, the memory cells described herein can be configured to function as multi-level cells, so that more than one bit of data can be stored in each cell 50. FIG. 12 illustrates an example of voltage states of a multi-level cell wherein two bits of data can be stored in each cell 50. In this case, a voltage less than or equal to a first predetermined voltage and greater than a second predetermined voltage that is less than the first predetermined voltage in floating body or base region 24 volts is interpreted as state "01", a voltage less than or equal to the second predetermined voltage is interpreted as state "00", a voltage greater than the first predetermined voltage and less than or equal to a third predetermined voltage that is greater than the first predetermined voltage is interpreted to be state "0" and a voltage greater than the third predetermined voltage is interpreted as state "11".

During the shadowing operation, the potential of the floating body or base region 24 in turn determines the amount of current flowing through the resistance change memory 40, which will in turn determine the state of the resistance change memory. The resistivity state of the resistance change memory 40 can then be configured to store multi-level bits.

During restore operation, the resistivity state of the resistance change memory 40 will subsequently determine the voltage state of the floating body or base region 24.

Figure 13A:
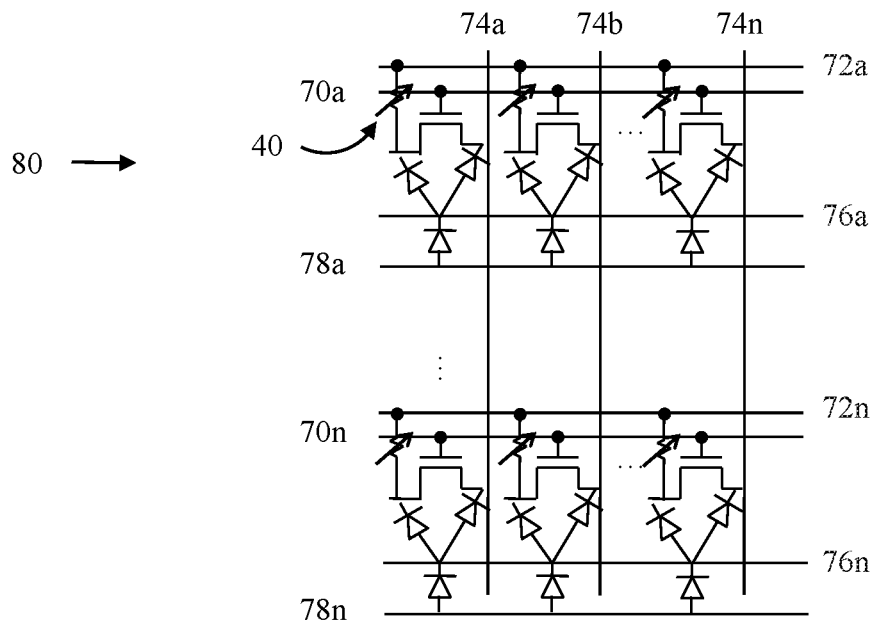
FIG. 13A is a schematic diagram showing an example of array architecture of a plurality of memory cells according to an embodiment of the present invention.

FIG. 13A shows an example of array architecture 80 of a plurality of memory cells 50 arranged in a plurality of rows and columns according to an embodiment of the present invention. The memory cells 50 are connected such that within each row, all of the gates 60 are connected by a common word line terminal 70. The first regions 18 are connected to resistance change materials 40. Within the same row, they are then connected by a common source line 72. Within each column, the second regions 16 are connected to a common bit line terminal 74. Within each row, all of the buried layers 22 are connected by a common buried well terminal 76. Likewise, within each row, all of the substrates 12 are connected by a common substrate terminal 78.

Figure 13B:
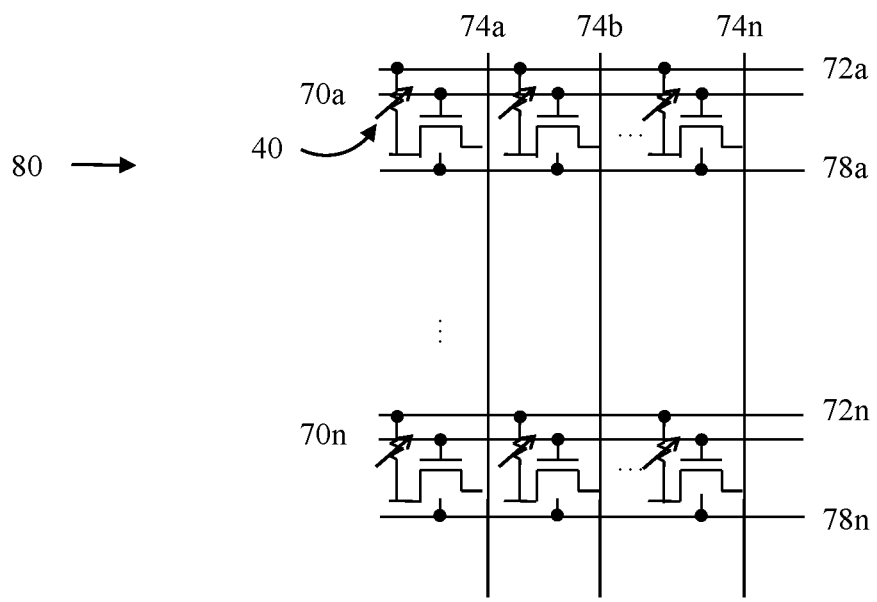
FIG. 13B is a schematic diagram showing an example of array architecture of a plurality of memory cells according to another embodiment of the present invention.

FIG. 13B shows an example of array architecture 80 of a plurality of memory cells 50 fabricated on a silicon-on-insulator (SOI) substrate, arranged in a plurality of rows and columns according to an embodiment of the present invention. The memory cells 50 are connected such that within each row, all of the gates 60 are connected by a common word line terminal 70. The first regions 18 are connected to resistance change materials 40. Within the same row, they are then connected by a common source line 72. Within each column, the second regions 16 are connected to a common bit line terminal 74. Likewise, within each row, all of the substrates 12 are connected by a common substrate terminal 78.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A semiconductor memory array comprising:
a plurality of semiconductor memory cells arranged in a matrix of rows and columns, wherein each said semiconductor memory cell comprises:
a bipolar device comprising a floating body having a first conductivity type selected from n-type conductivity type and p-type conductivity type and configured to store data when power is applied to said cell;
a nonvolatile memory comprising a resistance change element configured to store data stored in said bipolar device upon transfer thereto;
a buried layer region having a second conductivity type selected from said n-type conductivity type and said p-type conductivity type and being different from said first conductivity type; and
wherein said buried layer region is commonly connected to at least two of said memory cells.

2. The semiconductor memory array of claim 1, wherein said resistance change element comprises a phase change material.

3. The semiconductor memory array of claim 1, wherein said resistance change element comprises a metal-oxide-metal system.

4. The semiconductor memory array of claim 1, wherein said floating body is configured to store a state of said bipolar device.

5. The semiconductor memory array of claim 1, wherein said nonvolatile memory stores said data stored in said bipolar device upon loss of power to said cell, and wherein said cell is configured to perform a shadowing process during which said data in said bipolar device is loaded into and stored in said nonvolatile memory.

6. The semiconductor memory array of claim 1, wherein said bipolar device is fabricated on a silicon on insulator substrate.

7. The semiconductor memory array of claim 1, wherein said bipolar device is formed in a fin.

8. The semiconductor memory array of claim 1, wherein said resistance change element comprises a bottom electrode, a resistance change material and a top electrode.

9. The semiconductor memory array of claim 1, wherein said data stored in said bipolar device is transferred to said nonvolatile memory upon loss of power to said memory array.

10. The semiconductor memory array of claim 1, wherein said data stored in said bipolar device is transferred to said nonvolatile memory upon receiving an instruction to back up said data stored in said bipolar device.

11. A semiconductor memory array comprising:
a plurality of semiconductor memory cells arranged in a matrix of rows and columns, wherein each said semiconductor memory cell comprises:
a bipolar device comprising a floating body having a first conductivity type selected from n-type conductivity type and p-type conductivity type and configured to store data when power is applied to said cell;
a nonvolatile memory comprising a resistance change element configured to store data stored in said bipolar device upon transfer thereto;
a buried layer region having a second conductivity type selected from said n-type conductivity type and said p-type conductivity type and being different from said first conductivity type; and
a buried layer terminal electrically connected to said buried layer region;
wherein when a first memory cell of said plurality of semiconductor memory cells is in a first charge level and a second memory cell of said plurality of semiconductor memory cells is in a second charge level, upon said transfer of data, said first memory cell stores a first nonvolatile memory state and second memory cell stores a second nonvolatile memory state, said first and second nonvolatile memory states being non-algorithmically determined by said first and second charge levels of said first and second memory cells, respectively.

12. The semiconductor memory array of claim 11, wherein said resistance change element comprises a phase change material.

13. The semiconductor memory array of claim 11, wherein said resistance change element comprises a metal-oxide-metal system.

14. The semiconductor memory array of claim 11, wherein said floating body is configured to store a state of said bipolar device.

15. The semiconductor memory array of claim 11, wherein said nonvolatile memory stores said data stored in said bipolar device upon loss of power to said cell, and wherein said cell is configured to perform a shadowing process during which said data in said bipolar device is loaded into and stored in said nonvolatile memory.

16. The semiconductor memory array of claim 11, wherein said bipolar device is fabricated on a silicon on insulator substrate.

17. The semiconductor memory array of claim 11, wherein said bipolar device is formed in a fin.

18. The semiconductor memory array of claim 11, wherein said resistance change element comprises a bottom electrode, a resistance change material and a top electrode.

19. The semiconductor memory array of claim 11, wherein said data stored in said bipolar device is transferred to said nonvolatile memory upon loss of power to said memory array.

20. The semiconductor memory array of claim 11, wherein said data stored in said bipolar device is transferred to said nonvolatile memory upon receiving an instruction to back up said data stored in said bipolar device.

* * * * *